US012718859B2

(12) United States Patent
Irizarry et al.

(10) Patent No.: US 12,718,859 B2
(45) Date of Patent: Aug. 25, 2026

(54) APPARATUS AND METHODS FOR DECODER MODULES FOR NON-VOLATILE MEMORY

(71) Applicant: Sandisk Technologies, Inc., Milpitas, CA (US)

(72) Inventors: Nicolas Irizarry, Folsom, CA (US); Ashraf B. Islam, El Dorado Hills, CA (US); Jaydip Patel, Folsom, CA (US)

(73) Assignee: Sandisk Tehnologies, Inc., Milpitas, CA (US)

( * ) Notice: Subject to any disclaimer, the term of this patent is extended or adjusted under 35 U.S.C. 154(b) by 66 days.

(21) Appl. No.: 18/663,941

(22) Filed: May 14, 2024

(65) Prior Publication Data

US 2025/0356894 A1 Nov. 20, 2025

(51) Int. Cl.
*G11C 11/16* (2006.01)

(52) U.S. Cl.
CPC ...... *G11C 11/1659* (2013.01); *G11C 11/1655* (2013.01); *G11C 11/1657* (2013.01)

(58) Field of Classification Search
CPC ............ G11C 11/1659; G11C 11/1655; G11C 11/1657; G11C 11/1653; G11C 11/1673; G11C 11/1675; G11C 13/0026; G11C 13/0028; G11C 16/08
See application file for complete search history.

(56) References Cited

U.S. PATENT DOCUMENTS

| | | | | |
|---|---|---|---|---|
| 6,349,054 | B1 * | 2/2002 | Hidaka | G11C 11/1653 365/171 |
| 8,737,137 | B1 * | 5/2014 | Choy | G11C 16/08 365/185.23 |
| 2008/0025085 | A1 | 1/2008 | Scheuerlein et al. | |
| 2013/0010539 | A1 | 1/2013 | Shim et al. | |

FOREIGN PATENT DOCUMENTS

| | | | |
|---|---|---|---|
| TW | I345790 | B | 7/2011 |

OTHER PUBLICATIONS

International Search Report and Written Opinion for PCT/US2025/011226 dated May 24, 2025.

* cited by examiner

*Primary Examiner* — Sultana Begum
(74) *Attorney, Agent, or Firm* — PEARL COHEN LLP

(57) ABSTRACT

A non-volatile memory includes a memory array having a plurality of non-volatile memory cells, and a first decoder module coupled to the memory array. The first decoder module includes a first plurality of word line decoders coupled to the non-volatile memory cells, a first plurality of bit line decoders coupled to the non-volatile memory cells, a first multiplexor circuit configured to selectively couple one of the first plurality of word line decoders or one of the first plurality of bit line decoders to a positive bias node, and a second multiplexor circuit configured to selectively couple one of the first plurality of word line decoders or one of the first plurality of bit line decoders to a negative bias node. The first multiplexor circuit and the second multiplexor (Continued)

circuit are each coupled to a word line decoder and a bit line decoder outside a boundary of the first decoder module.

18 Claims, 31 Drawing Sheets

Memory Bay 170

Read/Write Circuits 184

Column Decoder 180

Column Decoder 190

Row Decoder 178

Memory Array 174

Row Decoder 172

Memory Array 176

Row Decoder 188

Column Decoder 182

Column Decoder 192

Read/Write Circuits 186

$MC_a$ = RESET
$400_a$
$MC_b$ = SET
$400_b$
$BLD0_a$
$WLD0_{S0a}$
$WLD0_{S0b}$
$BLD0_b$
$BLD1_a$
$WLD1_{S0a}$
$BLD1_b$
$WLD1_{S0b}$
$BLD2_a$
$WLD0_{S1a}$
$WLD0_{S1b}$
$BLD2_b$
BLD3a
$WLD1_{S1a}$
$BLD3_b$
$WLD1_{S1b}$

APPARATUS AND METHODS FOR DECODER MODULES FOR NON-VOLATILE MEMORY

BACKGROUND

Memory is widely used in various electronic devices such as cellular telephones, digital cameras, personal digital assistants, medical electronics, mobile computing devices, non-mobile computing devices and data servers. Memory may be non-volatile memory or volatile memory. A non-volatile memory allows information to be stored and retained even when the non-volatile memory is not connected to a source of power (e.g., a battery).

One example of a non-volatile memory is magnetoresistive random access memory (MRAM), which uses magnetization to represent stored data, in contrast to some other memory technologies that store data using electronic charge. Generally, MRAM includes a large number of magnetic memory cells formed on a semiconductor substrate, where each memory cell represents one bit of data.

A data bit is written to a memory cell by changing the direction of magnetization of a magnetic element within the memory cell, and a bit is read by measuring the resistance of the memory cell (low resistance typically represents a "0" bit, and high resistance typically represents a "1" bit). As used herein, direction of magnetization is the direction of orientation of the magnetic moment. Some memory cells may include a selector device, such as an ovonic threshold switch or other selector device.

Although MRAM is a promising technology, numerous design and process challenges remain.

DETAILED DESCRIPTION

Some non-volatile memory devices include arrays of decoder modules that each include word line decoders and bit line decoders coupled to non-volatile memory cells in a memory array. In some instances, as a result of the architecture and layout of the word line decoders and bit line decoders, some memory cells within an address space of a decoder module are physically located outside physical boundaries of the decoder module.

For example, a memory cell may be within the address space of a first decoder module, but may be physically located outside boundaries of the first decoder module. In particular, the memory cell may be physically located within boundaries of a second decoder module that is adjacent (e.g., above, below, left or right) of the first decoder module. In such instances a shifting scheme may be used in which the first decoder module "borrows" word line decoders and bit line decoders of the second decoder module to apply program or read voltages to the memory cell.

This shifting scheme works well for memory cells that are programmed and read using voltages all of one polarity. However, for some memory cells, such as some MRAM memory cells, programming and reading uses positive and negative voltages. A shifting scheme such as described above may be difficult to implement for such memory cells because some memory operations may require a decoder module to simultaneously apply positive voltages and negative voltages to word line decoders and bit line decoders within boundaries of the same decoder module. However, multiplexor circuits that are used in decoder modules to apply voltages to word line decoders and bit line decoders within the decoder module may be incapable of doing so.

Technology is described for decoder modules that implement address shifting schemes such as described above, and that may be used for addressing memory cells that are programmed and read using positive and negative voltages. In embodiments, decoder modules include a positive multiplexor circuit coupled to a positive bus, and a negative multiplexor circuit coupled to a negative bus. The positive bus and negative bus are coupled to word line decoders and bit line decoders physically located within boundaries of the decoder module. In addition, the positive bus and negative bus are coupled to word line decoders and bit line decoders physically located outside boundaries of the decoder module (e.g., word line decoders and bit line decoders physically located within boundaries of adjacent decoder modules).

Without wanting to be bound by any particular theory, it is believed that such technology provides decoder modules that can use address shifting schemes for addressing memory cells that are programmed and read using positive and negative voltages.

Figure 1A:
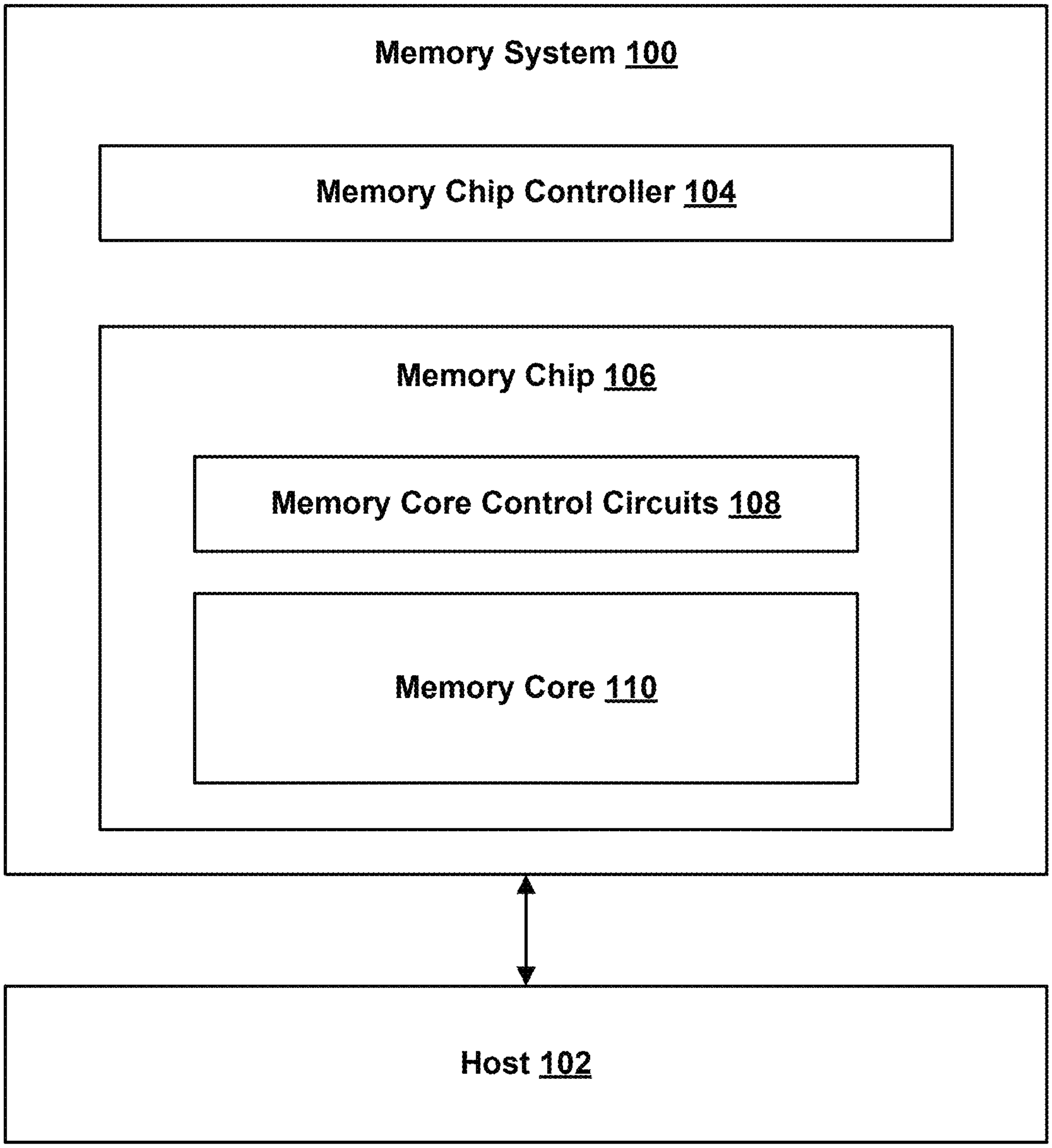
FIGS. 1A-1H depict various embodiments of a memory system.

FIG. 1A depicts one embodiment of a memory system 100 and a host 102. Memory system 100 may include a non-volatile storage system interfacing with host 102 (e.g., a mobile computing device or a server). In some cases, memory system 100 may be embedded within host 102. As examples, memory system 100 may be a memory card, a solid-state drive (SSD) such as a high-density MLC SSD (e.g., 2-bits/cell or 3-bits/cell) or a high performance SLC SSD, or a hybrid HDD/SSD drive.

As depicted, memory system 100 includes a memory chip controller 104 and a memory chip 106. Memory chip 106 may include volatile memory and/or non-volatile memory. Although a single memory chip is depicted, memory system 100 may include more than one memory chip. Memory chip controller 104 may receive data and commands from host 102 and provide memory chip data to host 102.

Memory chip controller 104 may include one or more of control circuitry, state machines, page registers, SRAM, decoders, sense amplifiers, read/write circuits, and/or controllers, or any combination thereof, for controlling the operation of memory chip 106. The one or more control circuitry, state machines, page registers, SRAM, decoders, sense amplifiers, read/write circuits, and/or controllers for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit or arranged on a single die. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, and generating row and column addresses.

Memory core 110 may include one or more two-dimensional arrays of memory cells and/or one or more three-dimensional arrays of memory cells. In an embodiment, memory core 110 may include re-writable memory cells, one-time programmable memory cells, and/or multi-time programmable memory cells, or any combination thereof.

In an embodiment, memory core control circuits 108 and memory core 110 may be arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 may send to memory chip controller 104 both a write command and the data to be written.

Memory chip controller 104 may buffer data to be written and may generate error correction code (ECC) data corresponding with the data to be written. The ECC data, which allows data errors that occur during transmission or storage to be detected and/or corrected, may be written to memory core 110 or stored in non-volatile memory within memory chip controller 104. In an embodiment, the ECC data are generated and data errors are corrected by circuitry within memory chip controller 104.

Memory chip controller 104 may control operation of memory chip 106. In an example, before issuing a write operation to memory chip 106, memory chip controller 104 may check a status register to make sure that memory chip 106 is able to accept the data to be written.

In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested.

Once memory chip controller 104 initiates a read or write operation, memory core control circuits 108 may generate appropriate bias voltages and/or currents for word lines and bit lines within memory core 110, as well as generate the appropriate memory block, row, and column addresses.

Figure 1B:
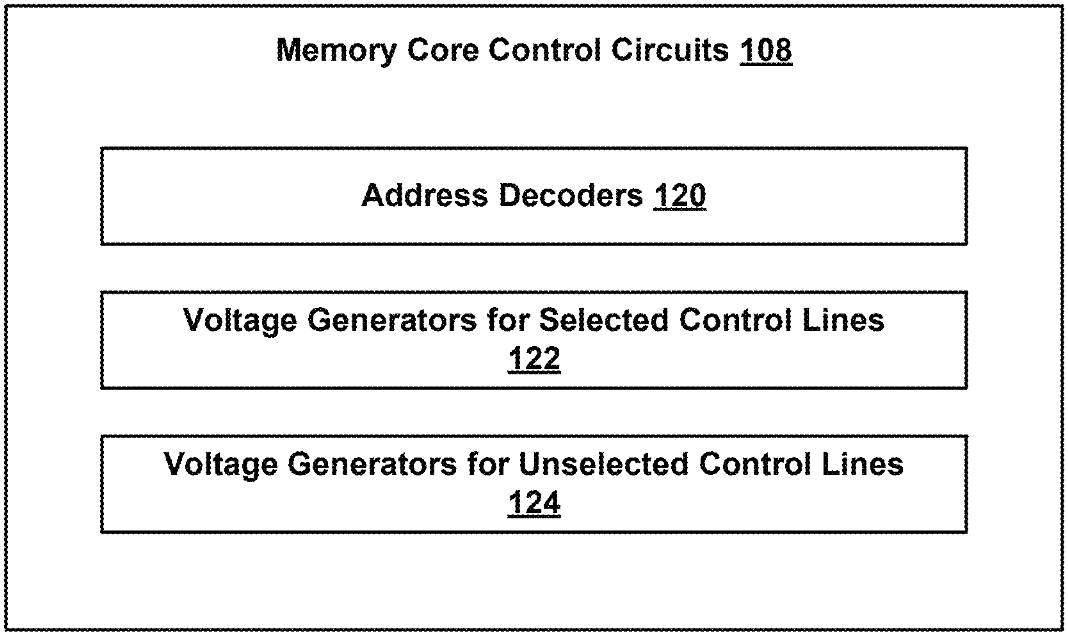

FIG. 1B depicts an embodiment of memory core control circuits 108. In an embodiment, memory core control circuits 108 include address decoders 120, voltage generators for selected control lines 122, and voltage generators for unselected control lines 124. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state.

Voltage generators (or voltage regulators) for selected control lines 122 may include one or more voltage generators for generating selected control line voltages. Voltage generators for unselected control lines 124 may include one or more voltage generators for generating unselected control line voltages. Address decoders 120 may generate memory block addresses, as well as row addresses and column addresses for a particular memory block.

FIGS. 1C-1F depict one embodiment of a memory core organization that includes a memory core 110 having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
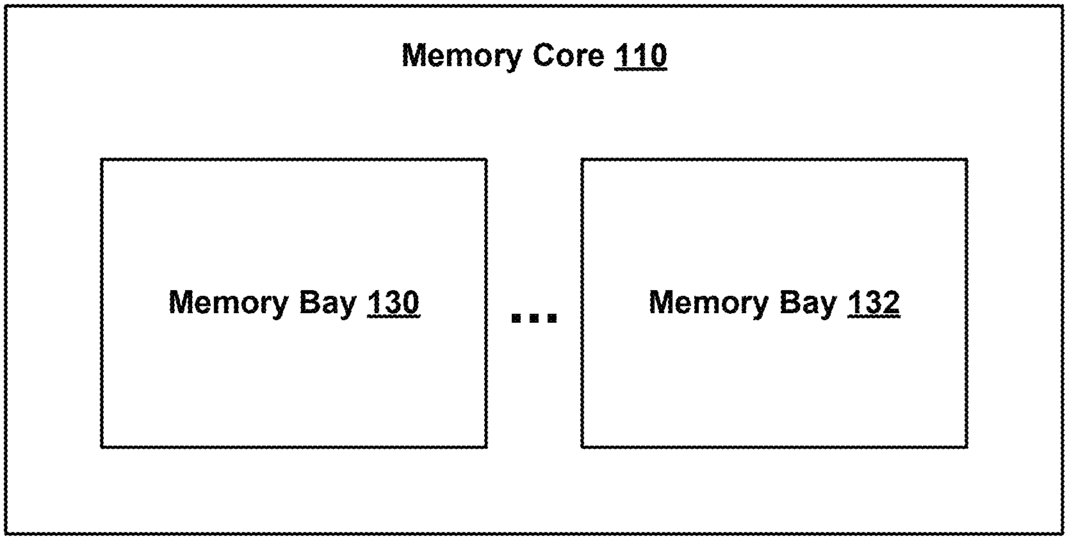

FIG. 1C depicts an embodiment of memory core 110 of FIG. 1A. As depicted, memory core 110 includes memory bay 130 and memory bay 132. In some embodiments, the number of memory bays per memory core can be different for different implementations. For example, a memory core may include only a single memory bay or multiple memory bays (e.g., 16 memory bays, 256 memory bays, etc.).

Figure 1D:
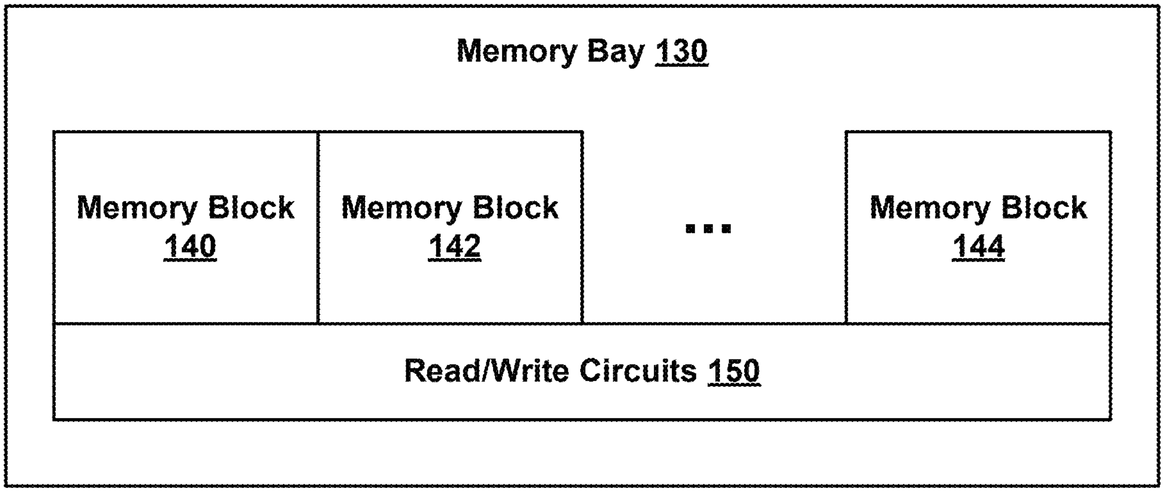

FIG. 1D depicts one embodiment of memory bay 130 of FIG. 1C. As depicted, memory bay 130 includes memory blocks 140-144 and read/write circuits 150. In some embodiments, the number of memory blocks per memory bay may be different for different implementations. For example, a memory bay may include one or more memory blocks (e.g., 32 memory blocks per memory bay).

Read/write circuits 150 include circuitry for reading and writing memory cells within memory blocks 140-144. As depicted, read/write circuits 150 may be shared across multiple memory blocks within a memory bay. This allows chip area to be reduced because a single group of read/write circuits 150 may be used to support multiple memory blocks. However, in some embodiments, only a single memory block may be electrically coupled to read/write circuits 150 at a particular time to avoid signal conflicts.

In some embodiments, read/write circuits 150 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In an example, memory system 100 of FIG. 1A may receive a write command including a target address and a set of data to be written to the target address. Memory system 100 may perform a read-before-write (RBW) operation to read the data currently stored at the target address before performing a write operation to write the set of data to the target address. Memory system 100 may then determine whether a particular memory cell may stay at its current state (i.e., the memory cell is already at the correct state), needs to be set to a "0" state, or needs to be reset to a "1" state.

Memory system 100 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells.

A particular memory cell may be SET to the "1" state by applying a first voltage difference across the particular memory cell of a first polarity (e.g., +1.5V). The particular memory cell may be RESET to the "0" state by applying a second voltage difference across the particular memory cell of a second polarity that is opposite to that of the first polarity (e.g., −1.5V).

In some cases, read/write circuits 150 may be used to program a particular memory cell to be in one of three or more data/resistance states (i.e., the particular memory cell may comprise a multi-level memory cell). In an example, read/write circuits 150 may apply a first voltage difference (e.g., 2V) across the particular memory cell to program the particular memory cell to a first state of the three or more data/resistance states, or a second voltage difference (e.g., 1V) across the particular memory cell that is less than the first voltage difference to program the particular memory cell to a second state of the three or more data/resistance states.

Applying a smaller voltage difference across the particular memory cell may cause the particular memory cell to be partially programmed or programmed at a slower rate than when applying a larger voltage difference. In another example, read/write circuits 150 may apply a first voltage difference across the particular memory cell for a first time period (e.g., 150 ns) to program the particular memory cell to a first state of the three or more data/resistance states, or apply the first voltage difference across the particular memory cell for a second time period less than the first time period (e.g., 50 ns). One or more programming pulses followed by a memory cell verification phase may be used to program the particular memory cell to be in the correct state.

Figure 1E:
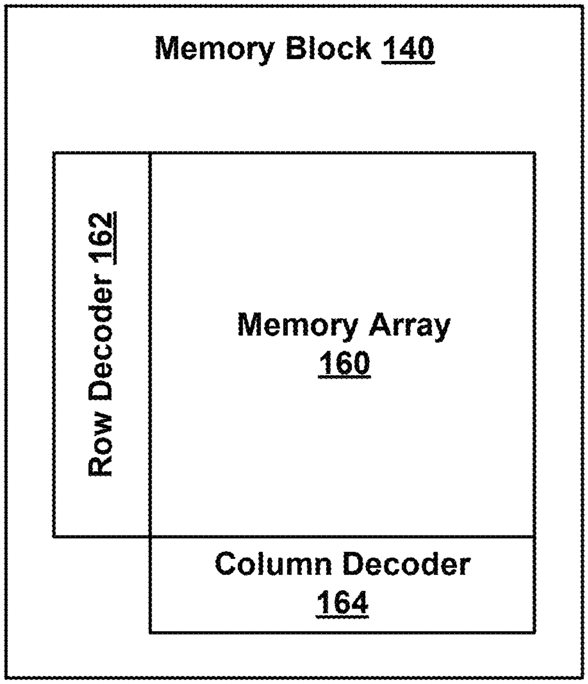

FIG. 1E depicts one embodiment of memory block 140 of FIG. 1D. As depicted, memory block 140 includes a memory array 160, a row decoder 162, and a column decoder 164. Memory array 160 may include a contiguous group of memory cells having contiguous word lines and bit lines. Memory array 160 may include one or more layers of memory cells, and may include a two-dimensional memory array and/or a three-dimensional memory array.

Row decoder 162 decodes a row address and selects a particular word line in memory array 160 when appropriate (e.g., when reading or writing memory cells in memory array 160). Column decoder 164 decodes a column address and selects a particular group of bit lines in memory array 160 to be electrically coupled to read/write circuits, such as read/write circuits 150 of FIG. 1D. In an embodiment, the number of word lines is 4K per memory layer, the number of bit lines is 1K per memory layer, and the number of memory layers is 4, providing a memory array 160 containing 16M memory cells. Other numbers of word lines per layer, bit lines per layer, and number of layers may be used.

Figure 1F:
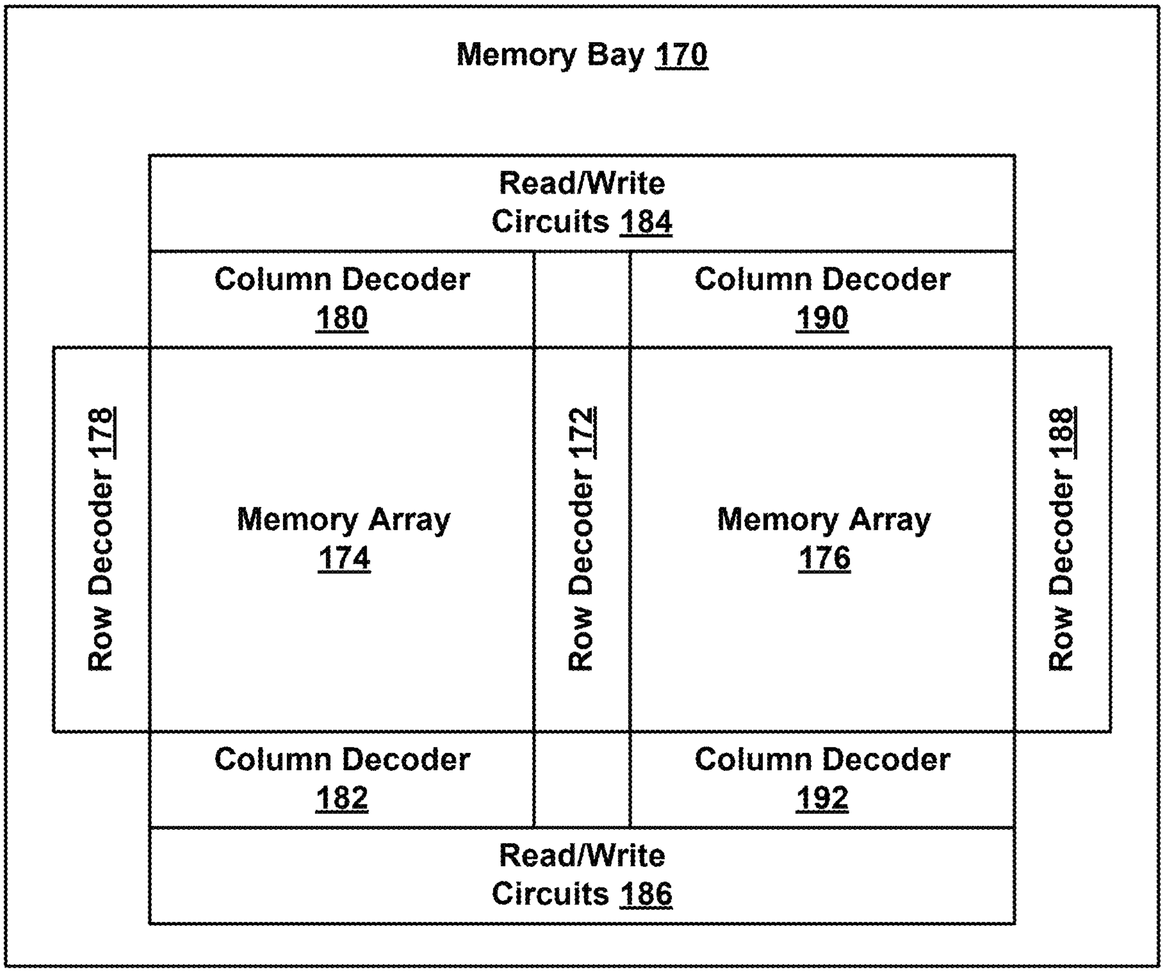

FIG. 1F depicts an embodiment of a memory bay 170. Memory bay 170 is an example of an alternative implementation for memory bay 130 of FIG. 1D. In some embodiments, row decoders, column decoders, and read/write circuits may be split or shared between memory arrays. As depicted, row decoder 172 is shared between memory arrays 174 and 176, because row decoder 172 controls word lines in both memory arrays 174 and 176 (i.e., the word lines driven by row decoder 172 are shared).

Row decoders 172 and 178 may be split such that odd word lines in memory array 174 are driven by row decoder 172 and even word lines in memory array 174 are driven by row decoder 178. Column decoders 180 and 182 may be split such that odd bit lines in memory array 174 are driven by column decoder 180 and even bit lines in memory array 174 are controlled by column decoder 182.

The selected bit lines controlled by column decoder 180 may be electrically coupled to read/write circuits 184. The selected bit lines controlled by column decoder 182 may be electrically coupled to read/write circuits 186. Splitting the read/write circuits into read/write circuits 184 and 186 when the column decoders are split may allow for a more efficient layout of the memory bay.

Row decoders 172 and 188 may be split such that odd word lines in memory array 176 are driven by row decoder 172 and even word lines in memory array 176 are driven by row decoder 188. Column decoders 190 and 192 may be split such that odd bit lines in memory array 176 are driven by column decoder 190 and even bit lines in memory array 176 are controlled by column decoder 192.

The selected bit lines controlled by column decoder 190 may be electrically coupled to read/write circuits 184. The selected bit lines controlled by column decoder 192 may be electrically coupled to read/write circuits 186. Splitting the read/write circuits into read/write circuits 184 and 186 when the column decoders are split may allow for a more efficient layout of the memory bay.

Figure 1G:
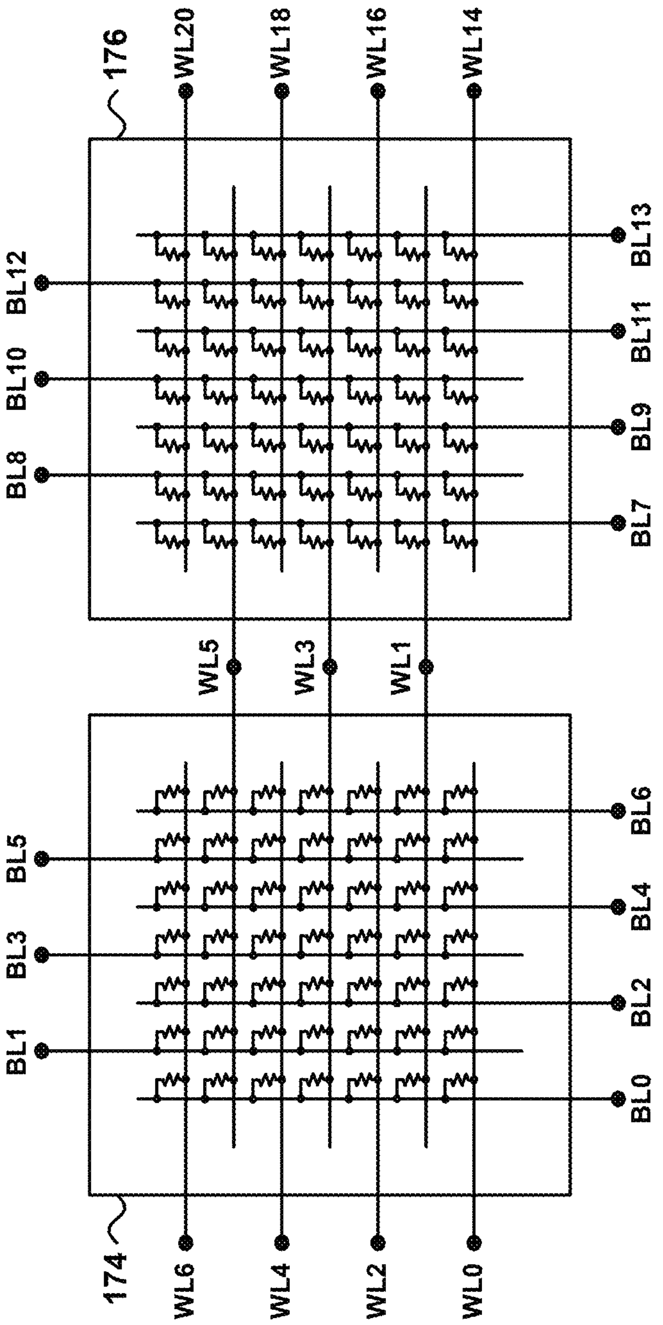

FIG. 1G depicts an embodiment of a schematic diagram (including word lines and bit lines) corresponding with memory bay 170 in FIG. 1F. As depicted, word lines WL1, WL3, and WL5 are shared between memory arrays 174 and 176 and controlled by row decoder 172 of FIG. 1F. Word lines WL0, WL2, WL4, and WL6 are driven from the left side of memory array 174 and controlled by row decoder 178 of FIG. 1F. Word lines WL14, WL16, WL18, and WL20 are driven from the right side of memory array 176 and controlled by row decoder 188 of FIG. 1F.

Bit lines BL0, BL2, BL4, and BL6 are driven from the bottom of memory array 174 and controlled by column decoder 182 of FIG. 1F. Bit lines BL1, BL3, and BL5 are driven from the top of memory array 174 and controlled by column decoder 180 of FIG. 1F. Bit lines BL7, BL9, BL11, and BL13 are driven from the bottom of memory array 176 and controlled by column decoder 192 of FIG. 1F. Bit lines BL8, BL10, and BL12 are driven from the top of memory array 176 and controlled by column decoder 190 of FIG. 1F.

In an embodiment, memory arrays 174 and 176 may include memory layers that are oriented in a plane that is horizontal to the supporting substrate. In another embodiment, memory arrays 174 and 176 may include memory layers that are oriented in a plane that is vertical with respect to the supporting substrate (i.e., the vertical plane is substantially perpendicular to the supporting substrate). In this case, the bit lines of the memory arrays may include substantially vertical bit lines.

Figure 1H:
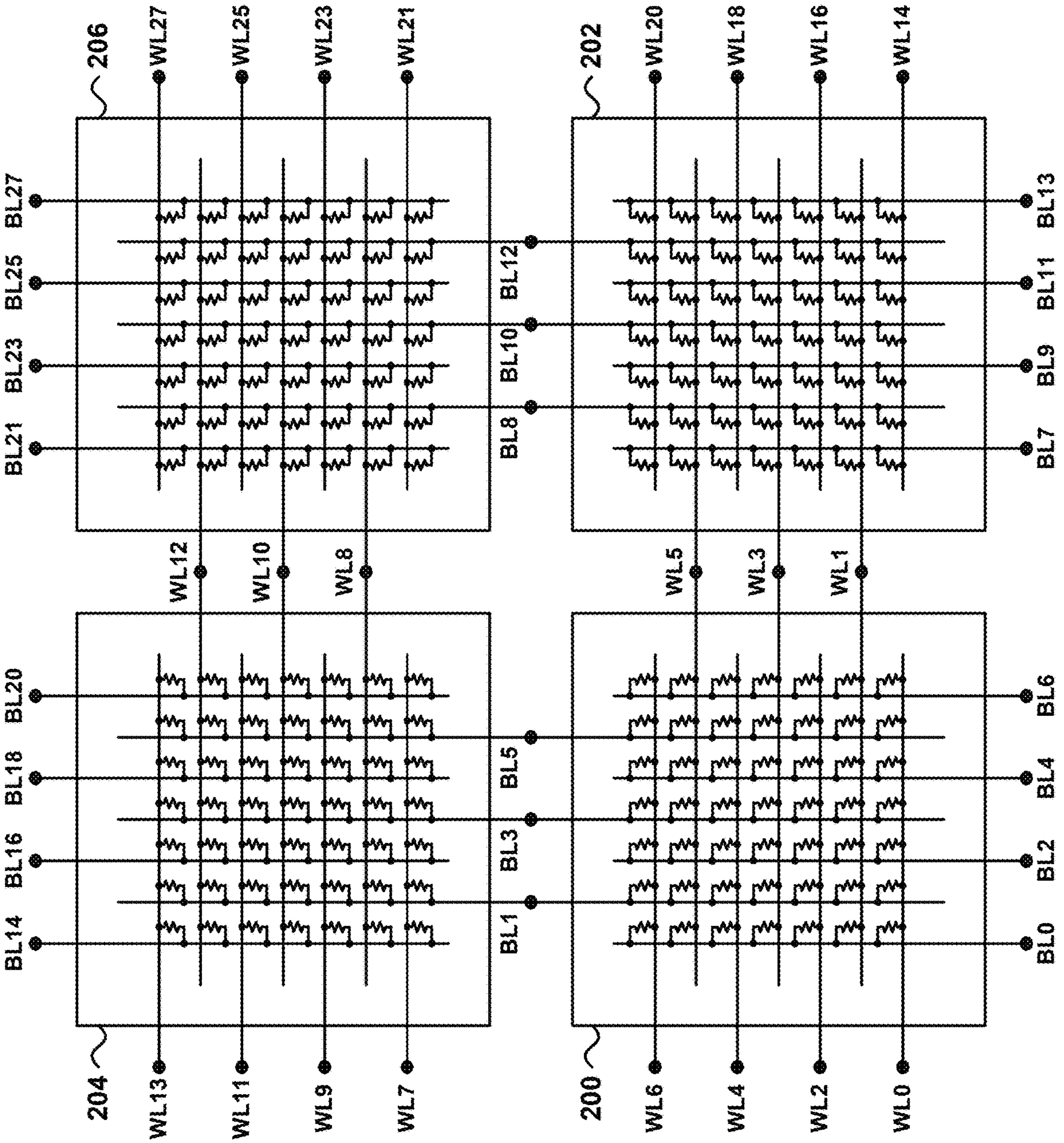

FIG. 1H depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area because a single row decoder and/or column decoder can be used to support two memory arrays.

As depicted, word lines WL1, WL3, and WL5 are shared between memory arrays 200 and 202. Bit lines BL1, BL3, and BL5 are shared between memory arrays 200 and 204. Word lines WL8, WL10, and WL12 are shared between memory arrays 204 and 206. Bit lines BL8, BL10, and BL12 are shared between memory arrays 202 and 206.

Row decoders are split such that word lines WL0, WL2, WL4, and WL6 are driven from the left side of memory array 200 and word lines WL1, WL3, and WL5 are driven from the right side of memory array 200. Likewise, word lines WL7, WL9, WL11, and WL13 are driven from the left side of memory array 204 and word lines WL8, WL10, and WL12 are driven from the right side of memory array 204.

Column decoders are split such that bit lines BL0, BL2, BL4, and BL6 are driven from the bottom of memory array 200 and bit lines BL1, BL3, and BL5 are driven from the top of memory array 200. Likewise, bit lines BL7, BL9, BL11, and BL13 are driven from the bottom of memory array 202 and bit lines BL8, BL10, and BL12 are driven from the top of memory array 202. Splitting row and/or column decoders also helps to relieve layout constraints (e.g., the column decoder pitch can be relieved by 2× since the split column decoders need only drive every other bit line instead of every bit line).

Figure 2A:
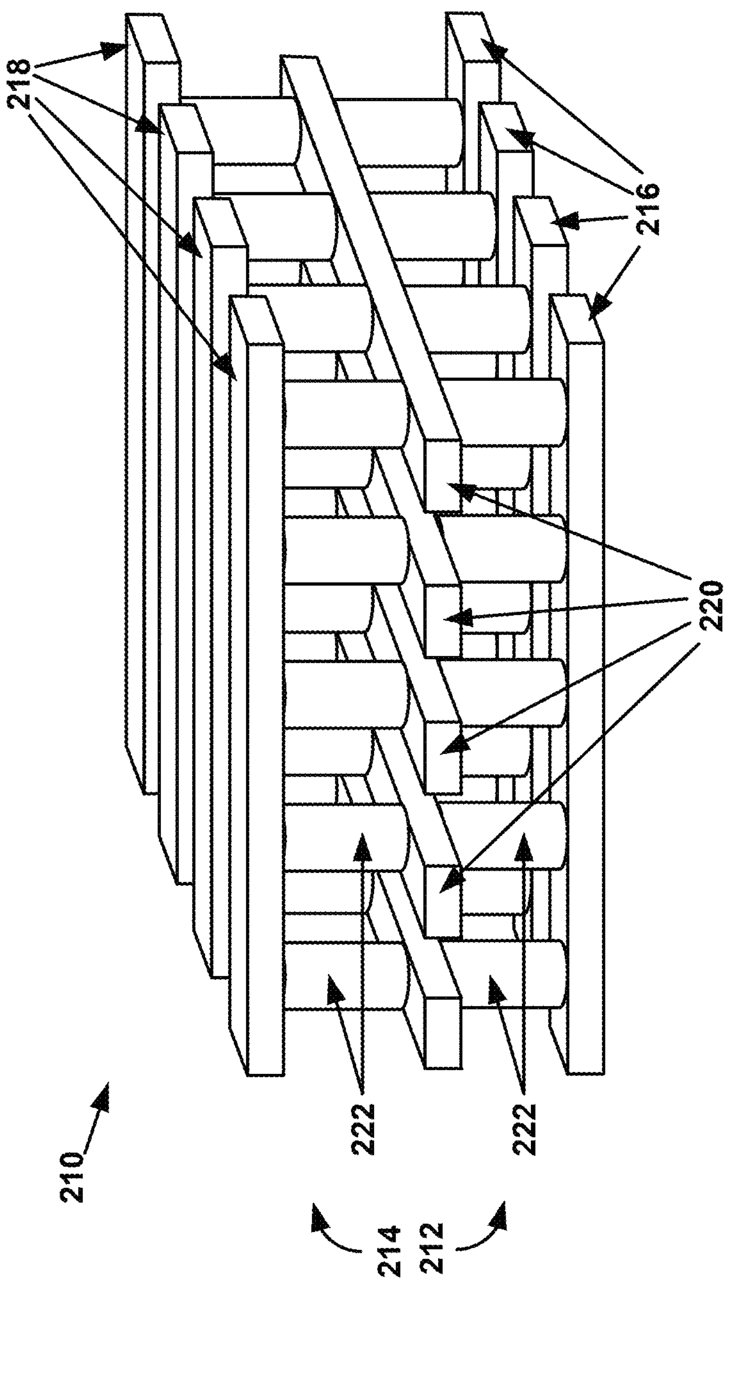
FIG. 2A depicts an embodiment of a portion of a three-dimensional memory array.

FIG. 2A depicts an embodiment of a portion of a monolithic three-dimensional memory array 210 that includes a first memory level 212, and a second memory level 214 positioned above first memory level 212. Memory array 210 is an example of an implementation of memory array 160 in FIG. 1E. Word lines 216 and 218 are arranged in a first direction and bit lines 220 are arranged in a second direction perpendicular to the first direction. As depicted, the upper conductors of first memory level 212 may be used as the lower conductors of second memory level 214. In a memory array with additional layers of memory cells, there would be corresponding additional layers of bit lines and word lines.

Memory array 210 includes a plurality of memory cells 222, where each memory cell is disposed at an intersection between one of word lines 216/218 and one of bit lines 220. A memory array such as memory array 210 is sometimes referred to as a cross-point memory array.

In embodiments, memory cells 222 may include rewriteable memory cells, one-time programmable memory cells, and multi-time programmable memory cells. In an embodiment, each of memory cells 222 are vertically-oriented. Memory cells 222 may include non-volatile memory cells or volatile memory cells. With respect to first memory level 212, a first portion of memory cells 222 are between and connect to word lines 216 and bit lines 220. With respect to second memory level 214, a second portion of memory cells 222 are between and connect to word lines 218 and bit lines 220.

In an embodiment, each memory cell 222 includes a selector element coupled in series with a resistance-switching memory element, where each memory cell 222 represents one bit of data. In an embodiment, the resistance-switching memory element may be a magnetic memory element, a ReRAM memory element, a phase change memory element or other type of resistance-switching memory element.

In an embodiment, each memory cell 222 includes a selector element coupled in series with a magnetic memory element, where each memory cell 222 represents one bit of data. FIG. 2B is a simplified schematic diagram of a memory cell 222*a*, which is one example implementation of memory cells 222 of FIG. 2A.

In an embodiment, memory cell 222*a* includes a magnetic memory element $M_x$ coupled in series with a selector element $S_x$, both coupled between a first terminal T1 and a second terminal T2. In an embodiment, memory cell 222*a* is vertically-oriented. In the embodiment of FIG. 2B, magnetic memory element $M_x$ is disposed above selector element $S_x$. In other embodiments, selector element $S_x$ may be disposed above magnetic memory element $M_x$.

In an embodiment, magnetic memory element $M_x$ is a magnetic tunnel junction, and selector element $S_x$ is a threshold selector device. In an embodiment, selector element $S_x$ is a conductive bridge threshold selector device. In other embodiments, selector element $S_x$ is an ovonic threshold switch (e.g., binary SiTe, CTe, BTe, AlTe, etc., or the ternary type AsTeSi, AsTeGe or AsTeGeSiN, etc.), a Metal Insulator Transition (MIT) of a Phase Transition Material type (e.g., $VO_2$, $NbO_2$ etc.), or other similar threshold selector device.

In an embodiment, magnetic memory element $M_x$ includes an upper ferromagnetic layer 230, a lower ferromagnetic layer 232, and a tunnel barrier (TB) 234 which is an insulating layer between the two ferromagnetic layers. In this example, lower ferromagnetic layer 232 is a free layer (FL) that has a direction of magnetization that can be switched. Upper ferromagnetic layer 230 is the pinned (or fixed) layer (PL) that has a direction of magnetization that is not easily changed.

In other embodiments, magnetic memory element $M_x$ may include fewer, additional, or different layers than those depicted in FIG. 2B. In other embodiments, lower ferromagnetic layer 232 is a pinned layer (PL) and upper ferromagnetic layer 230 is the free layer (FL).

When the direction of magnetization in free layer 232 is parallel to that of pinned layer 230, memory element $M_x$ has a relatively low resistance (referred to herein as the "P state"), and when the direction of magnetization in free layer 232 is anti-parallel to that of pinned layer 230, memory element $M_x$ has a relatively high resistance (referred to herein as the "AP state").

In an embodiment, the data state ("0" or "1") of magnetic memory element $M_x$ is read by measuring the resistance of magnetic memory element $M_x$. By design, both the parallel and anti-parallel configurations remain stable in the quiescent state and/or during a read operation (at sufficiently low read current).

In an embodiment, selector element $S_x$ is an ovonic threshold switch that includes a first region 236 and optionally includes a second region 238 disposed above first region 236. In an embodiment, first region 236 is a SiTe alloy, and optional second region 238 is carbon nitride. Other materials may be used for first region 236 and optional second region 238. In other embodiments, selector element $S_x$ is a conductive bridge threshold selector element. In an embodiment, first region 236 is a solid electrolyte region, and second region 238 is an ion source region.

Figure 2C:
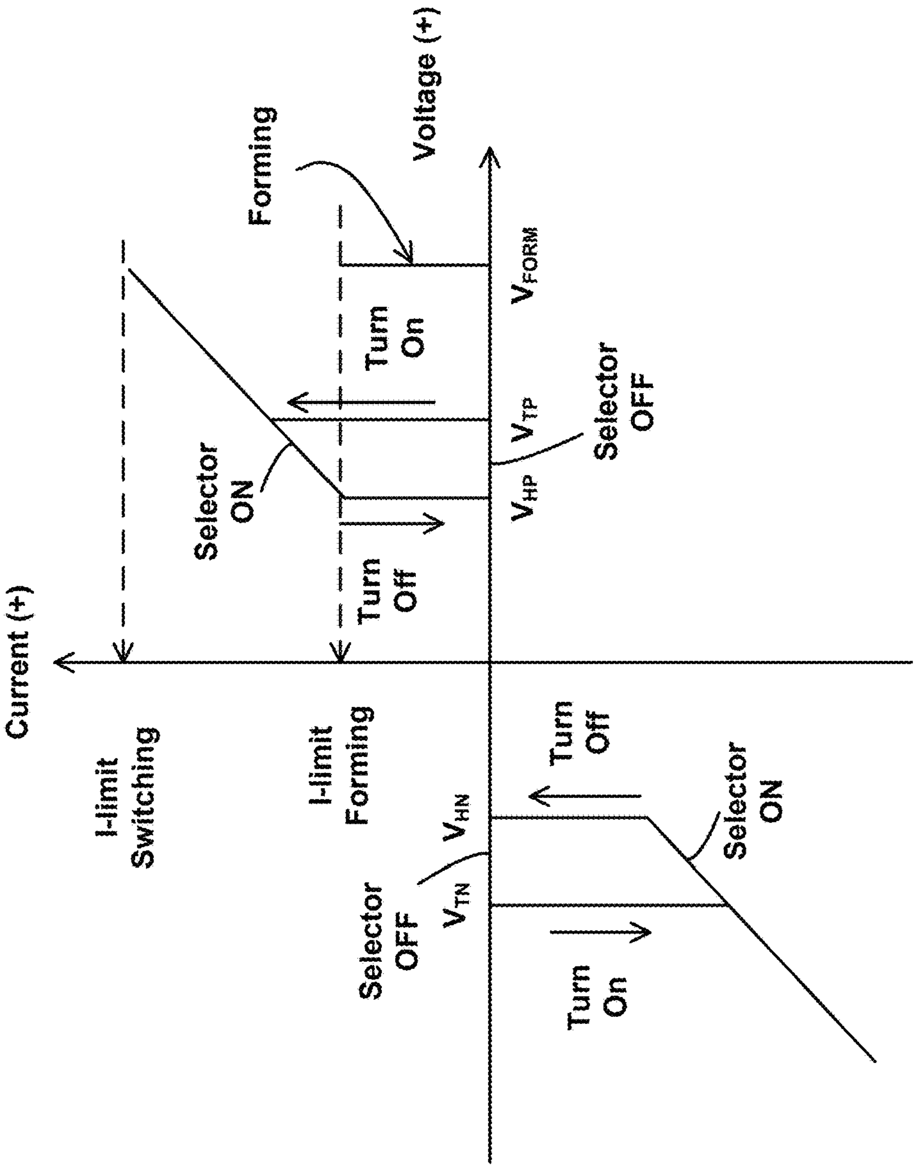
FIG. 2C depicts an example current-voltage characteristic of a threshold selector device of FIG. 2B.
Figure 2B:
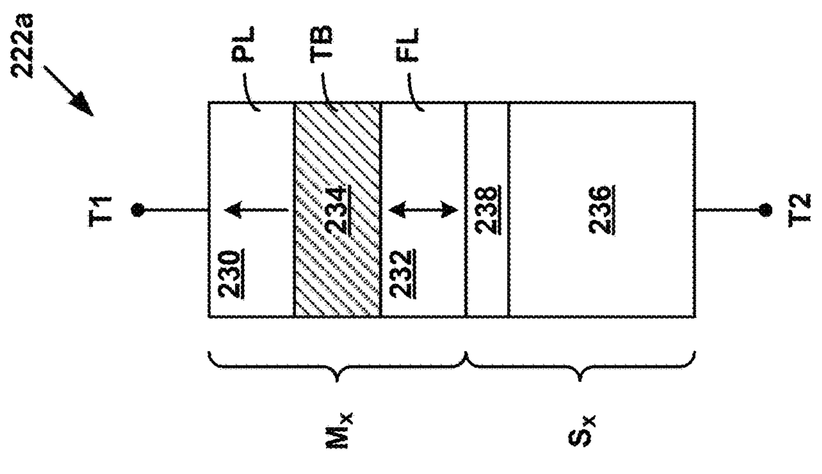
FIG. 2B depicts an embodiment of a memory cell of the three-dimensional memory array of FIG. 2A.

FIG. 2C is a diagram depicting example current-voltage (I-V) characteristics of a threshold selector device $S_x$. Each threshold selector device $S_x$ is initially in a high resistance (OFF) state. To operate threshold selector device $S_x$ as a threshold switch, an initial forming operation may be necessary so that threshold selector device $S_x$ operates in a current range in which switching can occur.

For example, a forming operation may include applying to threshold selector device $S_x$ one or more voltage pulses each having a magnitude greater than or equal to a forming voltage VFORM. Following the forming operation, threshold selector device $S_x$ may be switched ON and OFF, and may be used as either a unipolar or a bipolar threshold selector device. Accordingly, threshold selector device $S_x$ may be referred to as a bipolar threshold selector device.

In the example I-V characteristics of FIG. 2C, for positive applied voltages, threshold selector device $S_x$ remains in a high resistance state (HRS) (e.g., OFF) until the voltage across the device meets or exceeds (i.e., is more positive than) a first threshold voltage, VTP, at which point threshold selector device $S_x$ switches to a low resistance state (LRS) (e.g., ON). Threshold selector device $S_x$ remains turned ON until the voltage across the device drops to or below a first hold voltage, VHP, at which point threshold selector device $S_x$ turns OFF.

For negative applied voltages, threshold selector device $S_x$ remains in a HRS (e.g., OFF) until the voltage across the device meets or exceeds (i.e., is more negative than) a second threshold voltage, $V_{TN}$, at which point threshold selector device $S_x$ switches to a LRS (e.g., ON). Threshold selector device $S_x$ remains turned ON until the voltage across the device increases to or exceeds (i.e., is less negative than) a second hold voltage, VHN, at which point threshold selector device $S_x$ turns OFF.

Referring again to FIG. 2B, in an embodiment, magnetic memory element $M_x$ uses spin-transfer-torque (STT) switching. To "set" a bit value of magnetic memory element $M_x$ (i.e., choose the direction of the free layer magnetization), an electrical write current is applied from first terminal T1 to second terminal T2. The electrons in the write current become spin-polarized as they pass through pinned layer 230 because pinned layer 230 is a ferromagnetic metal.

A substantial majority of the conduction electrons in a ferromagnet will have a spin orientation that is parallel to the direction of magnetization, yielding a net spin polarized current. (Electron spin refers to angular momentum, which is directly proportional to but anti-parallel in direction to the magnetic moment of the electron, but this directional distinction will not be used going forward for ease of discussion.)

When the spin-polarized electrons tunnel across TB 234, conservation of angular momentum can result in the imparting of a torque on both free layer 232 and pinned layer 230, but this torque is inadequate (by design) to affect the direction of magnetization of pinned layer 230. Contrastingly, this torque is (by design) sufficient to switch the direction of magnetization of free layer 232 to become parallel to that of pinned layer 230 if the initial direction of magnetization of free layer 232 was anti-parallel to pinned layer 230. The parallel magnetizations will then remain stable before and after such write current is turned OFF.

In contrast, if free layer 232 and pinned layer 230 magnetizations are initially parallel, the direction of magnetization of free layer 232 can be STT-switched to become anti-parallel to that of pinned layer 230 by applying a write current of opposite direction to the aforementioned case. Thus, by way of the same STT physics, the direction of the magnetization of free-layer 232 can be deterministically set into either of two stable orientations by judicious choice of the write current direction (polarity).

In the example described above, spin-transfer-torque (STT) switching is used to "set" a bit value of magnetic memory element $M_x$. In other embodiments, field-induced switching, spin orbit torque (SOT) switching, VCMA (magnetoelectric) switching, or other switching techniques may be employed.

Figure 3A:
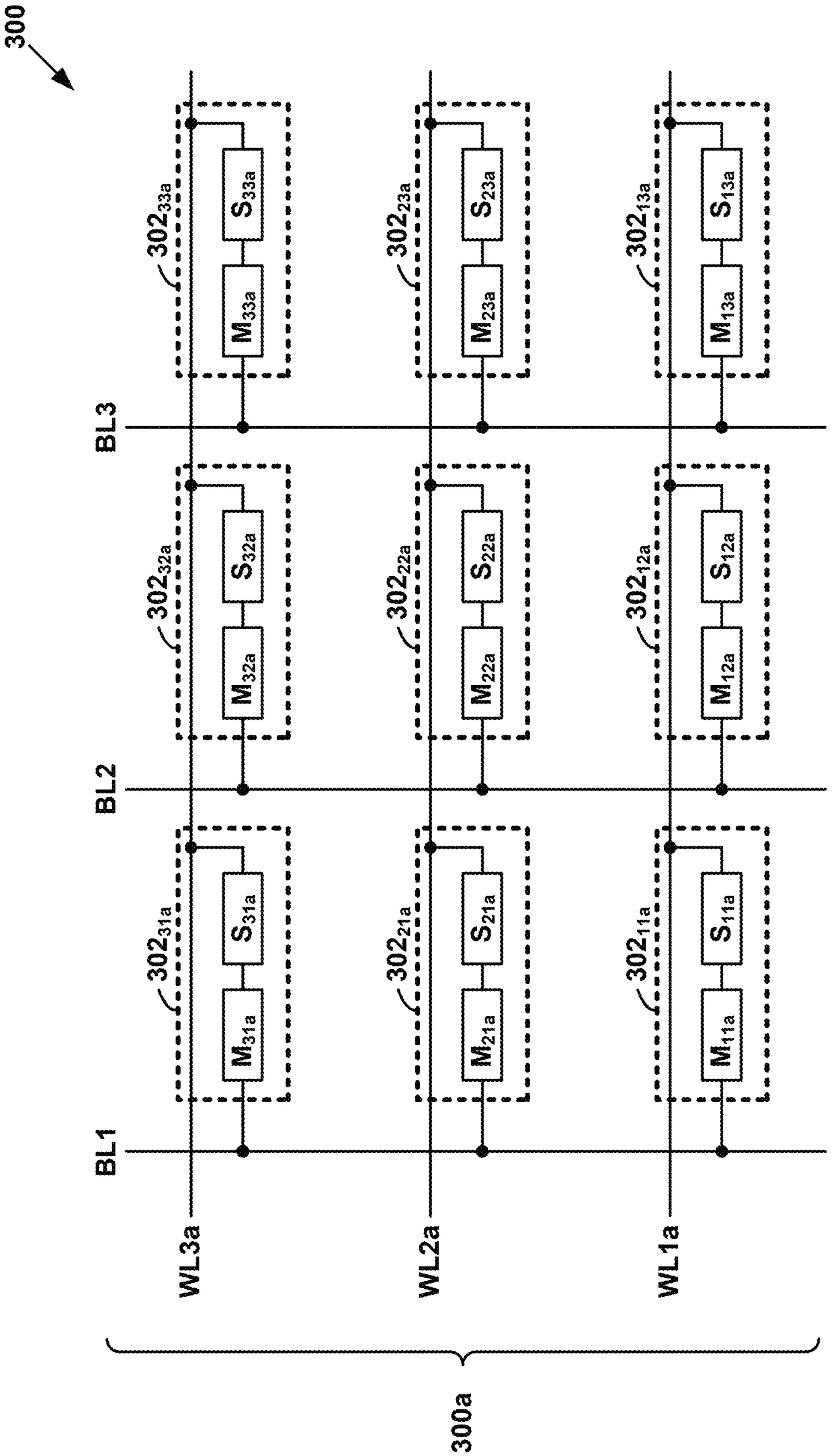
FIGS. 3A-3B depict an embodiment of a cross-point memory array.
Figure 3B:
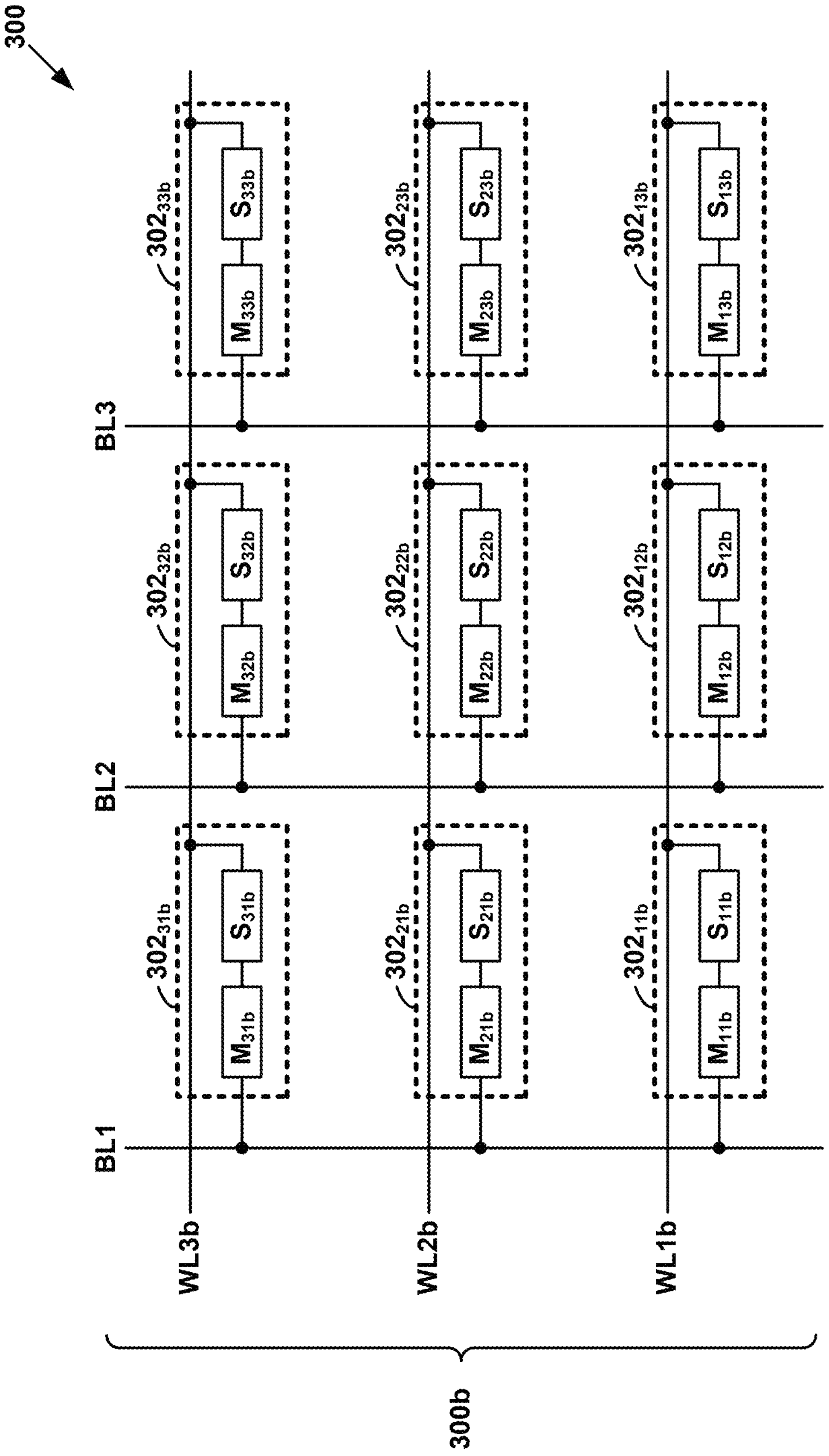

FIGS. 3A-3B are simplified schematic diagrams of an example cross-point memory array 300 which includes a first memory level 300*a*, and a second memory level 300*b* positioned above first memory level 300*a*. Cross-point memory array 300 is an example of an implementation of memory array 160 in FIG. 1E. Cross-point memory array 300 may include more than two memory levels.

Cross-point memory array 300 includes word lines WL1*a*, WL2*a*, WL3*a*, WL1*b*, WL2*b*, and WL3*b*, and bit lines BL1, BL2, and BL3. First memory level 300*a* includes memory cells $\mathbf{302}_{11b}$, $\mathbf{302}_{12b}$, . . . , $\mathbf{302}_{33b}$ coupled to word lines WL1*a*, WL2*a*, WL3*a* and bit lines BL1, BL2, and BL3, and second memory level 300*b* includes memory cells $\mathbf{301}_{11b}$, $\mathbf{302}_{12b}$, . . . , $\mathbf{302}_{33b}$ coupled to word lines WL1*b*, WL2*b*, WL3*b* and bit lines BL1, BL2, and BL3. In an embodiment, each of memory cells $\mathbf{302}_{11a}$, $\mathbf{302}_{12a}$, . . . , $\mathbf{302}_{33a}$ are vertically-oriented. In an embodiment, each of memory cells $\mathbf{302}_{11b}$, $\mathbf{302}_{12b}$, . . . , $\mathbf{302}_{33b}$ are vertically-oriented.

First memory level 300*a* is one example of an implementation for first memory level 212 of monolithic three-dimensional memory array 210 of FIG. 2A, and second memory level 300*b* is one example of an implementation for second memory level 214 of monolithic three-dimensional memory array 210 of FIG. 2A. In an embodiment, each of memory cells $\mathbf{302}_{11a}$, $\mathbf{302}_{12a}$, . . . , $\mathbf{302}_{33a}$, $\mathbf{302}_{11b}$, $\mathbf{302}_{12b}$, . . . , $\mathbf{302}_{33b}$, is an implementation of memory cell 222*a* of FIG. 2B.

Persons of ordinary skill in the art will understand that cross-point memory array 300 may include more or less than six word lines, more or less than three bit lines, and more or less than eighteen memory cells $\mathbf{302}_{11a}$, $\mathbf{302}_{12a}$, . . . , $\mathbf{302}_{33a}$, $\mathbf{302}_{11b}$, $\mathbf{302}_{12b}$, . . . , $\mathbf{302}_{33b}$. In some embodiments, cross-point memory array 300 may include 1000×1000 memory cells, although other array sizes may be used.

Each memory cell $\mathbf{302}_{11a}$, $\mathbf{302}_{12a}$, . . . , $\mathbf{302}_{33a}$, $\mathbf{302}_{11b}$, $\mathbf{302}_{12b}$, . . . , $\mathbf{302}_{33b}$ is coupled to one of the word lines and one of the bit lines, and includes a corresponding magnetic memory element $M_{11a}$, $M_{12a}$, . . . , $M_{33a}$, $M_{11b}$, $M_{12b}$, . . . , $M_{33b}$, respectively, coupled in series with a corresponding selector element $S_{11a}$, $S_{12a}$, . . . , $S_{33a}$, $S_{11b}$, $S_{12b}$, . . . , $S_{33b}$, respectively. In an embodiment, each of magnetic memory elements $M_{11a}$, $M_{12a}$, . . . , $M_{33a}$, $M_{11b}$, $M_{12b}$, . . . , $M_{33b}$ is an implementation of magnetic memory element $M_x$ of FIG. 2B, and each of selector elements $S_{11a}$, $S_{12a}$, . . . , $S_{33a}$, $S_{11b}$, $S_{12b}$, . . . , $S_{33b}$ is an implementation of selector element $S_x$ of FIG. 2B.

Each memory cell $\mathbf{302}_{11a}$, $\mathbf{302}_{12a}$, . . . , $\mathbf{302}_{33a}$ has a first terminal coupled to one of bit lines BL1, BL2, BL3, and a second terminal coupled to one of word lines WL1*a*, WL2*a*, WL3*a*, and each memory cell $\mathbf{302}_{11b}$, $\mathbf{302}_{12b}$, . . . , $\mathbf{302}_{33b}$ has a first terminal coupled to one of bit lines BL1, BL2, BL3, and a second terminal coupled to one of word lines WL1*b*, WL2*b*, WL3*b*. For example, memory cell 30213*a* includes magnetic memory element $M_{13a}$ coupled in series with selector element $S_{13a}$, and includes a first terminal coupled to bit line BL3, and a second terminal coupled to word line WL1*a*.

Likewise, memory cell $\mathbf{302}_{22b}$ includes magnetic memory element $M_{22b}$ coupled in series with selector element $S_{22b}$, and includes a first terminal coupled to bit line BL2, and a second terminal coupled to word line WL2*b*. Similarly, memory cell $\mathbf{302}_{33a}$ includes magnetic memory element $M_{33a}$ coupled in series with selector element $S_{33a}$, and includes a first terminal coupled to bit line BL3, and a second terminal coupled to word line WL3*a*.

Magnetic memory elements $M_{11a}$, $M_{12a}$, . . . , $M_{33a}$ may be disposed above or below corresponding selector elements $S_{11a}$, $S_{12a}$, . . . , $S_{33a}$, respectively, and magnetic memory elements $M_{11b}$, $M_{12b}$, . . . , $M_{33b}$, may be disposed above or below corresponding selector elements $S_{11b}$, $S_{12b}$, . . . , $S_{33b}$, respectively.

In an embodiment, the orientation of memory cells $\mathbf{302}_{11a}$, $\mathbf{302}_{12a}$, . . . , $\mathbf{302}_{33a}$ of first memory level 300*a* is the same as the orientation of memory cell $\mathbf{302}_{11b}$, $\mathbf{302}_{12b}$, . . . , $\mathbf{302}_{33b}$ of second memory level 300*b*.

In another embodiment, the orientation of memory cells $\mathbf{302}_{11a}$, $\mathbf{302}_{12a}$, . . . , $\mathbf{302}_{33a}$ of first memory level 300*a* is opposite the orientation of memory cell $\mathbf{302}_{11b}$, $\mathbf{302}_{12b}$, . . . , $\mathbf{302}_{33b}$ of second memory level 300*b*.

Referring again to FIG. 1A, in an embodiment memory core 110 may include one or more two-dimensional arrays of memory cells and/or one or more three-dimensional arrays of memory cells. In an embodiment, memory core 110 may include re-writable memory cells, one-time programmable memory cells, and/or multi-time programmable memory cells, or any combination thereof.

As described above in connection with FIG. 1E, in an embodiment memory block 140 includes a memory array 160, a row decoder 162, and a column decoder 164. In an embodiment, row decoder 162 decodes a row address and selects a particular word line in memory array 160, and column decoder 164 decodes a column address and selects a particular group of bit lines in memory array 160.

In embodiments, the row decoders (such as row decoder 162), and column decoders (such as column decoder 164) are arranged in an architecture that includes multiple decoder modules, with each decoder module including a first number $N_W$ of word line decoders and a second number $N_B$ of bit line decoders.

Figure 4A:
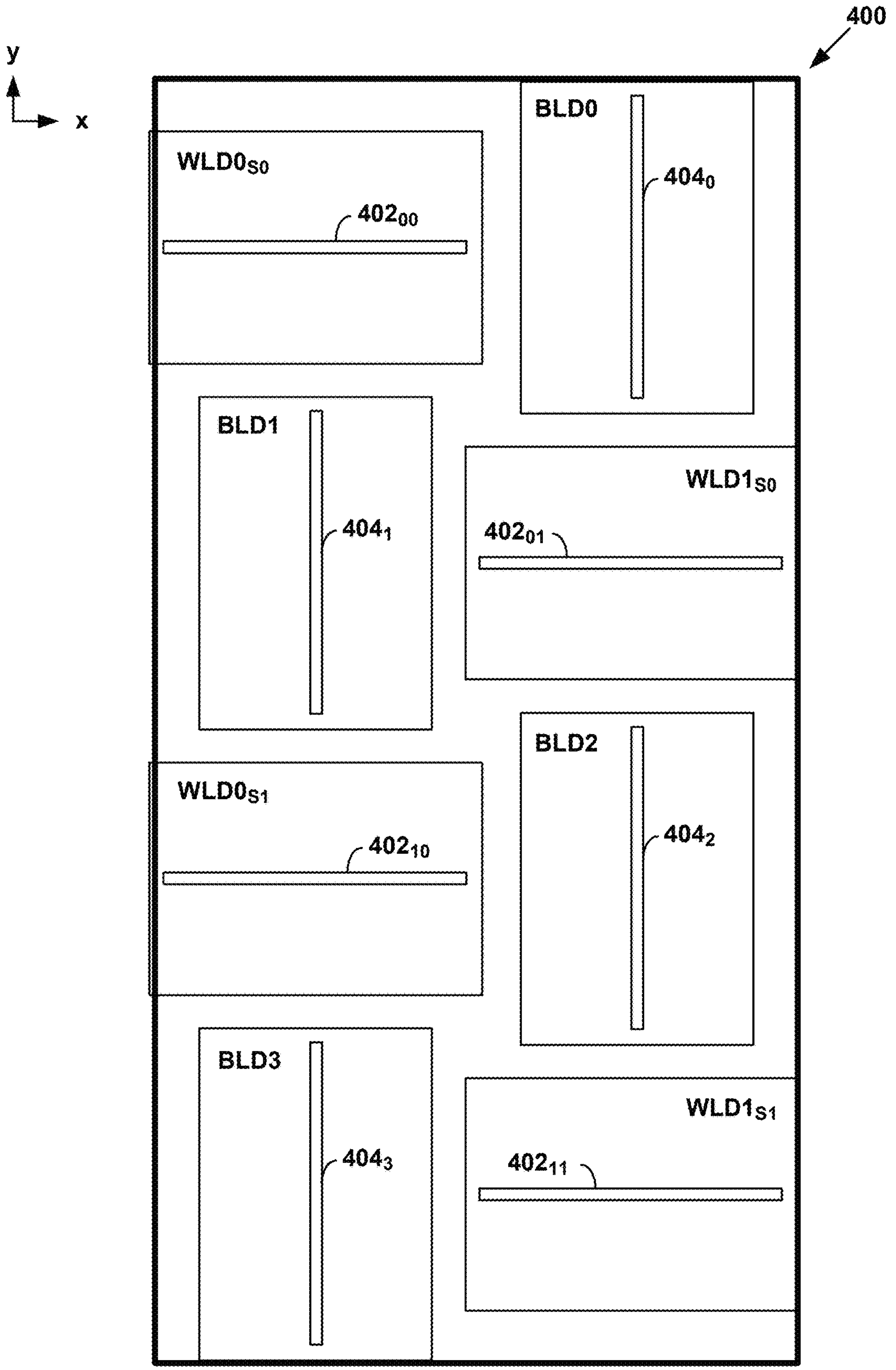
FIG. 4A depicts a top view of an embodiment of a decoder module of word line decoders and bit line decoders.

FIG. 4A depicts a top view of an embodiment of such a decoder module 400, which includes first number $N_W$=4 word line decoders WLD0$_{S0}$, WLD1$_{S0}$, WLD0$_{S1}$ and WLD1$_{S1}$, and $N_B$=4 bit line decoders BLD0, BLD1, BLD2 and BLD3. Persons of ordinary skill in the art will understand that decoder module 400 alternatively may include more than or fewer than 4 word line decoders and 4 bit line decoders.

In an embodiment, each of word line decoders WLD0$_{S0}$, WLD1$_{S0}$, WLD0$_{S1}$ and WLD1$_{S1}$ includes a corresponding word line hookup region $\mathbf{402}_{00}$, $\mathbf{402}_{01}$, $\mathbf{402}_{10}$ and $\mathbf{402}_{11}$, respectively, and each of bit line decoders BLD0, BLD1, BLD2 and BLD3 includes a corresponding bit line hook up region $\mathbf{404}_0$, $\mathbf{404}_1$, $\mathbf{404}_2$ and $\mathbf{404}_3$, respectively.

In embodiments, each of word line decoders WLD0$_{S0}$, WLD1$_{S0}$, WLD0$_{S1}$ and WLD1$_{S1}$ is coupled to a third number $N_{WL}$ of word lines via the corresponding word line hookup region 402, and each of bit line decoders BLD0, BLD1, BLD2 and BLD3 is coupled to a fourth number $N_{BL}$ of bit lines via the corresponding bit line hook up region 404. To avoid overcrowding the drawing FIG. 4A does not depict the word lines or bit lines.

Figure 4B:
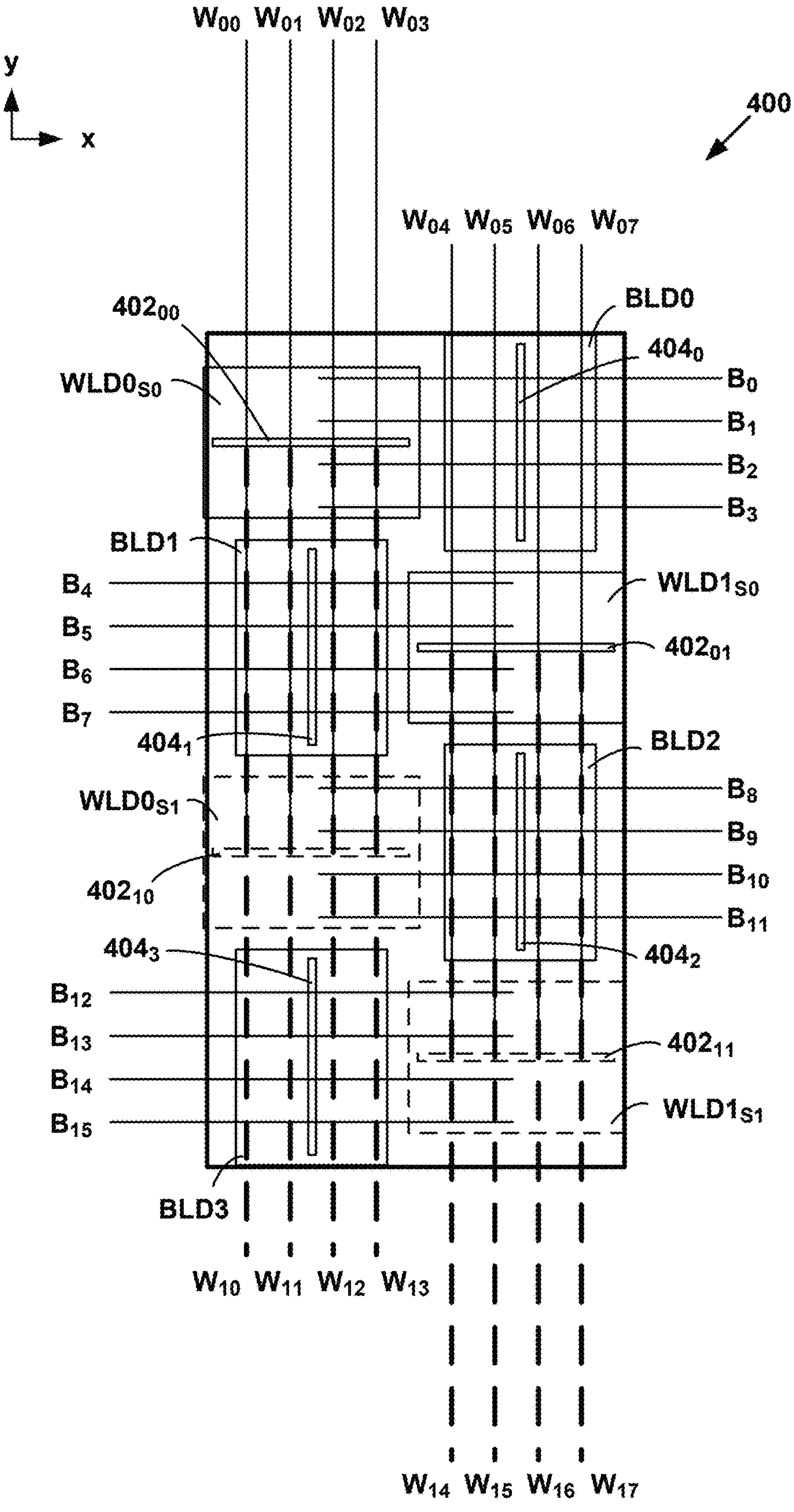
FIG. 4B depicts another top view of the example decoder module of FIG. 4A.

FIG. 4B is another top view of decoder module 400, in which each of word line decoders WLD0$_{S0}$, WLD1$_{S0}$, WLD0$_{S1}$ and WLD1$_{S1}$ is coupled to third number $N_{WL}$=4 word lines, and each of bit line decoders BLD0, BLD1, BLD2 and BLD3 is coupled to fourth number $N_{BL}$=4 bit lines. Persons of ordinary skill in the art will understand that each of word line decoders WLD0$_{S0}$, WLD1$_{S0}$, WLD0$_{S1}$ and WLD1$_{S1}$ alternatively may be coupled to more or fewer than 4 word lines, and bit line decoders BLD0, BLD1, BLD2 and BLD3 alternatively may be coupled to more or fewer than 4 bit lines.

In the embodiment of FIG. 4B, word line decoder WLD0$_{S0}$ is coupled at word line hookup region $\mathbf{402}_{00}$ to word lines $W_{00}$, $W_{01}$, $W_{02}$ and $W_{03}$, word line decoder WLD1$_{S0}$ is coupled at word line hookup region $\mathbf{402}_{01}$ to word lines $W_{04}$, $W_{05}$, $W_{06}$ and $W_{07}$, word line decoder WLD0$_{S1}$ is coupled at word line hookup region $\mathbf{402}_{10}$ to word lines $W_{10}$, $W_{11}$, $W_{12}$ and $W_{13}$, and word line decoder WLD1$_{S1}$ is coupled at word line hookup region $\mathbf{402}_{11}$ to word lines $W_{14}$, $W_{15}$, $W_{16}$ and $W_{17}$.

In an embodiment, word lines $W_{00}$, $W_{01}$, . . . , $W_{07}$, and word lines $W_{10}$, $W_{11}$, . . . , $W_{17}$ are disposed between two different levels (also referred to herein as "stories"). In an embodiment, word lines $W_{00}$, $W_{01}$, . . . , $W_{07}$ are disposed in a first story (e.g., "Story 0" or "S0") and word lines $W_{10}$, $W_{11}$, . . . , $W_{17}$ are disposed in a second story (e.g., "Story 1" or "S1") above Story 0.

Figure 4C:
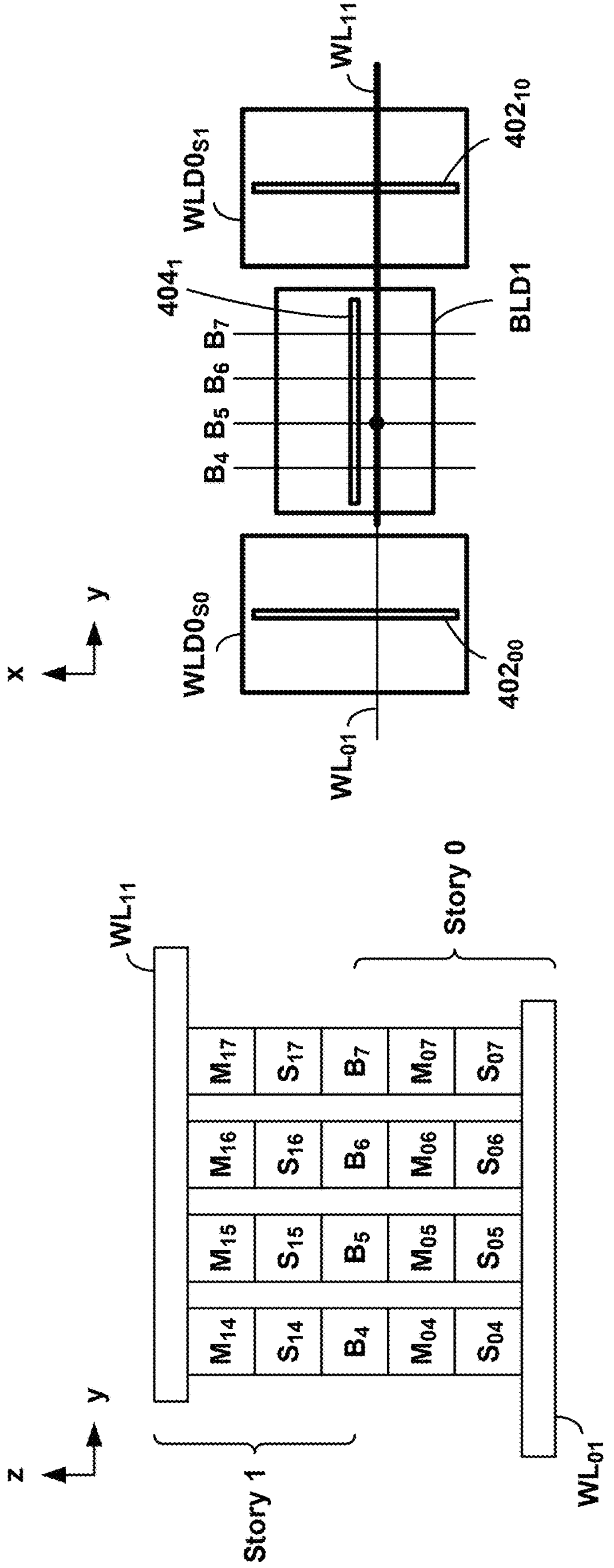
FIG. 4C depicts cross-sectional and top views of a portion of the example decoder module of FIG. 4B.

For example, FIG. 4C depicts cross-sectional and top views of a portion of decoder module 400 of FIG. 4B. In particular, FIG. 4C depicts a top view of word line decoders WLD0$_{S0}$ and WLD0$_{S1}$ and bit line decoder BLD1. To avoid obscuring the drawing, only portions of word lines $WL_{01}$ and $WL_{11}$ and bit lines $B_4$, $B_5$, $B_6$ and $B_7$ are depicted.

FIG. 4C also depicts a cross-sectional view showing word line $WL_{01}$ disposed in Story 0, word line $WL_{11}$ disposed in Story 1, and bit lines $B_4$, $B_5$, $B_6$ and $B_7$ disposed between word lines $WL_{01}$ and $WL_{11}$. Memory cells are disposed in Story 0 at intersections between word line $WL_{01}$ and bit lines $B_4$, $B_5$, $B_6$ and $B_7$, and in Story 1 at intersections between word line $WL_{11}$ and bit lines $B_4$, $B_5$, $B_6$ and $B_7$. In an embodiment, each memory cell includes a magnetic memory element $M_x$ coupled in series with a selector element $S_x$.

In particular, Story 0 includes a first memory cell (including magnetic memory element $M_{04}$ coupled in series with selector element $S_{04}$) disposed between word line $WL_{01}$ and bit line $B_4$, a second memory cell (including magnetic memory element $M_{05}$ coupled in series with selector element $S_{05}$) disposed between word line $WL_{01}$ and bit line $B_5$, a third memory cell (including magnetic memory element $M_{06}$ coupled in series with selector element $S_{06}$) disposed between word line $WL_{01}$ and bit line $B_6$, and a fourth memory cell (including magnetic memory element $M_{07}$ coupled in series with selector element $S_{07}$) disposed between word line $WL_{01}$ and bit line $B_7$.

Likewise, Story 1 includes a first memory cell (including magnetic memory element $M_{14}$ coupled in series with selector element $S_{14}$) disposed between word line $WL_{11}$ and bit line $B_4$, a second memory cell (including magnetic memory element $M_{15}$ coupled in series with selector element $S_{15}$) disposed between word line $WL_{11}$ and bit line $B_5$, a third memory cell (including magnetic memory element $M_{16}$ coupled in series with selector element $S_{16}$) disposed between word line $WL_{11}$ and bit line $B_6$, and a fourth memory cell (including magnetic memory element $M_{17}$ coupled in series with selector element $S_{17}$) disposed between word line $WL_{11}$ and bit line $B_7$.

In an embodiment, decoder module 400 is coupled to $2\times N_{WL}$ word lines that are disposed along a first axis (e.g., an x-axis) on each of Story 0 and Story 1, and is coupled to $4\times N_{BL}$ bit lines that are disposed along a second axis (e.g., a y-axis). Thus, with $N_{WL}=4$ and $N_{BL}=4$, decoder module 400 of FIG. 4B is coupled to 16 bit lines and 16 word lines, and thus can address 256 memory cells. That is, 128 memory cells in Story 0 and 128 memory cells in Story 1.

Figure 4D:
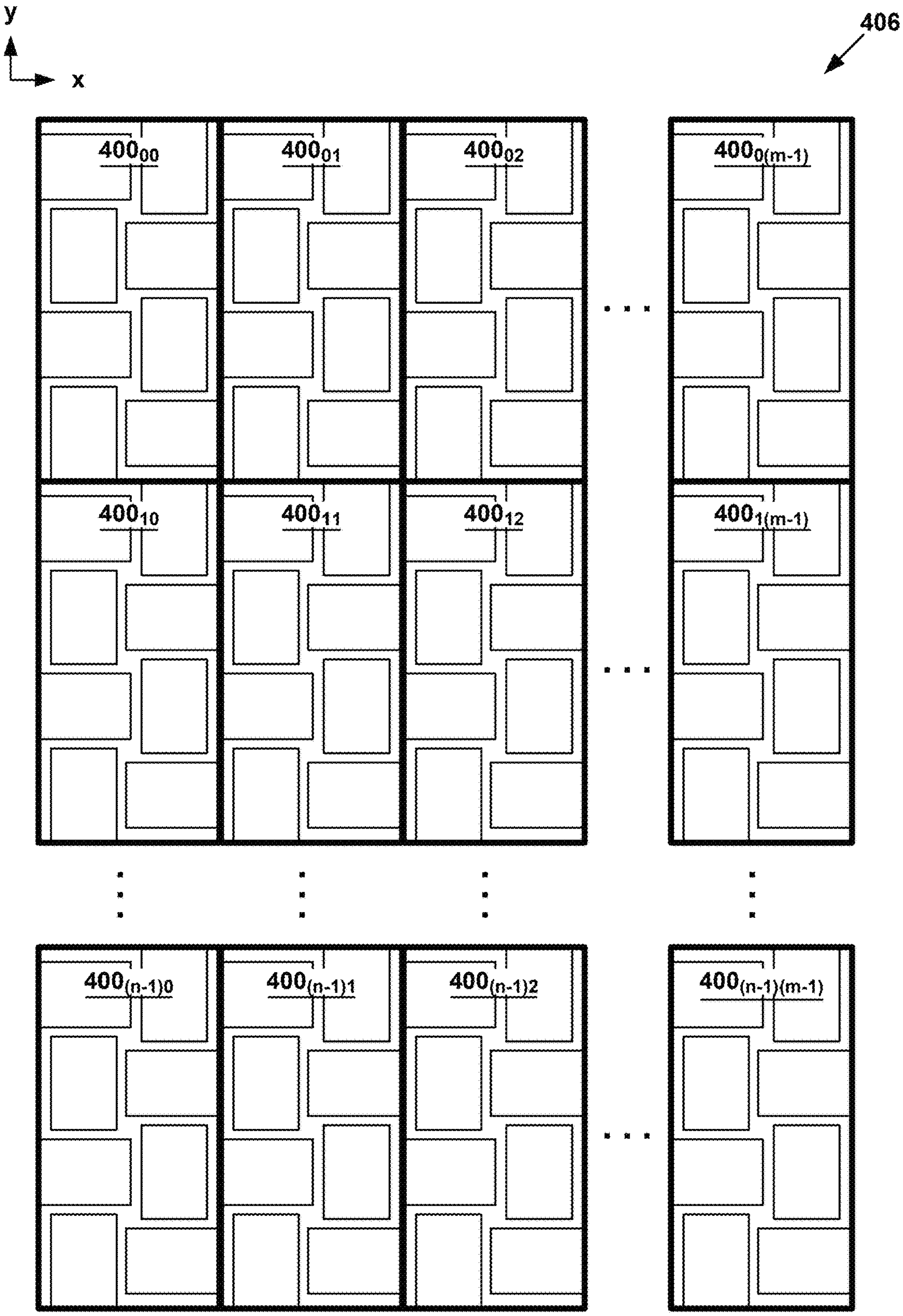
FIG. 4D depicts a diagram depicting an array of n rows and m columns of example decoder modules of FIG. 4B.

In an embodiment, multiple such decoder modules 400 may be used to address a larger number of memory cells. For example, FIG. 4D is a diagram depicting an array 406 of n rows and m columns of decoder modules $\mathbf{400}_{00}$, $\mathbf{400}_{01}$, $\mathbf{400}_{02}$, . . . , $\mathbf{400}_{(n-1)(m-1)}$, each a replica of decoder module 400 of FIG. 4B. To avoid overcrowding the drawing, word lines, bit lines, word line hookup regions and bit line hookup regions have been omitted.

Referring again to FIG. 4B, in an embodiment word line hookup regions 402 are disposed parallel to the first axis (e.g., the x-axis) in the center of each word line decoder $\mathrm{WLD}\mathbf{0}_{S0}$, $\mathrm{WLD}\mathbf{1}_{S0}$, $\mathrm{WLD}\mathbf{0}_{S1}$ and $\mathrm{WLD}\mathbf{1}_{S1}$, and bit line hookup regions 404 are disposed parallel to the second axis (e.g., the y-axis) in the center of each bit line decoder BLD0, BLD1, BLD2 and BLD3, where the first axis is perpendicular to the second axis.

In an embodiment, word lines $W_{00}$, $W_{01}$, . . . , $W_{07}$, $W_{10}$, $W_{11}$, . . . , $W_{17}$ extend outward in both directions from word line hookup regions 402 along an axis parallel to the second axis (e.g., the y-axis). In an embodiment, each of word lines $W_{00}$, $W_{10}$, . . . , $W_{07}$, $W_{10}$, $W_{11}$, . . . , $W_{17}$ span $(2\times N_{BL})$ bit lines above and $(2\times N_{BL})$ bit lines below the corresponding word line hookup region 402. In the example of FIG. 4B, each of word lines $W_{00}$, $W_{01}$, . . . , $W_{07}$, $W_{10}$, $W_{11}$, . . . , $W_{17}$ span 8 bit lines above and 8 bit lines below the corresponding word line hookup region 402.

In an embodiment, bit lines $B_0$, $B_1$, $B_2$, . . . , $B_{15}$ extend outward in both directions from bit line hookup regions 404 along an axis parallel to the first axis (e.g., the x-axis). In an embodiment, each of bit lines $B_0$, $B_1$, $B_2$, . . . , $B_{15}$ span $N_{WL}$ word lines to the left and $N_{WL}$ word lines to the right of the corresponding bit line hookup region 404. In the example of FIG. 4B, each of bit lines $B_0$, $B_1$, $B_2$, . . . , $B_{15}$ span 4 word lines to the left and 4 word lines to the right of the corresponding bit line hookup region 404.

In an embodiment, by virtue of the location of word line hookup regions 402 and bit line hookup regions 404, and the locations of the word line decoders $\mathrm{WLD}\mathbf{0}_{S0}$, $\mathrm{WLD}\mathbf{1}_{S0}$, $\mathrm{WLD}\mathbf{0}_{S1}$ and $\mathrm{WLD}\mathbf{1}_{S1}$ and bit line decoders BLD0, BLD1, BLD2 and BLD3, word lines $W_{00}$, $W_{01}$, . . . , $W_{07}$ extend beyond the upper boundary of decoder module 400, and word lines $W_{10}$, $W_{11}$, . . . , $W_{17}$ extend beyond the lower boundary of decoder module 400.

In an embodiment, by virtue of the location of word line hookup regions 402 and bit line hookup regions 404, and the locations of the word line decoders $\mathrm{WLD}\mathbf{0}_{S0}$, $\mathrm{WLD}\mathbf{1}_{S0}$, $\mathrm{WLD}\mathbf{0}_{S1}$ and $\mathrm{WLD}\mathbf{1}_{S1}$ and bit line decoders BLD0, BLD1, BLD2 and BLD3, bit lines $B_0$, $B_1$, $B_2$, $B_3$, $B_8$, $B_9$, $B_{10}$, $B_{11}$ extend beyond the right boundary of decoder module 400, and bit lines $B_4$, $B_5$, $B_6$, $B_7$, $B_{12}$, $B_{13}$, $B_{14}$, $B_{15}$ extend beyond the left boundary of decoder module 400.

Figure 4E:
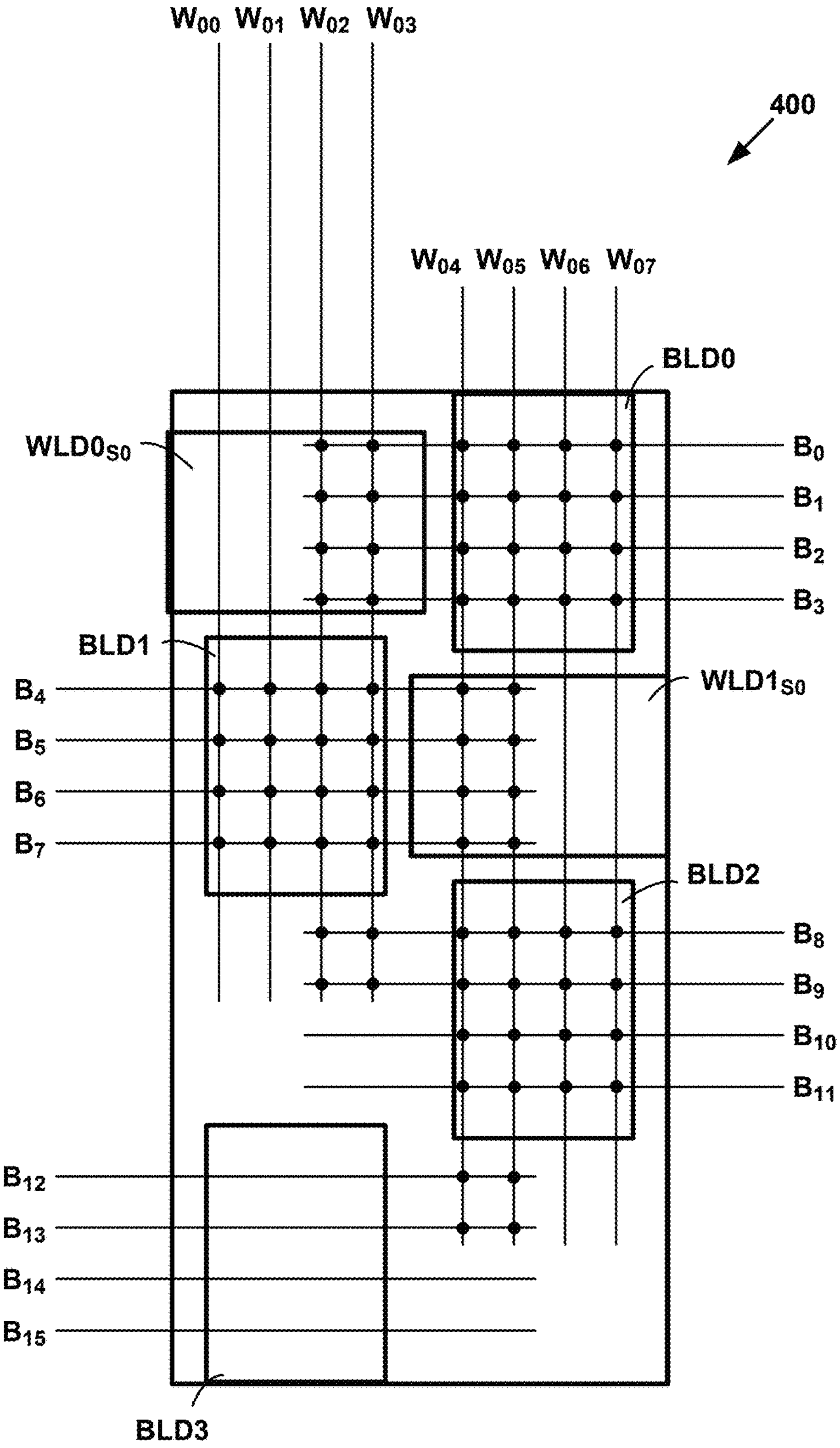
FIG. 4E depicts the example decoder module of FIG. B with a first set of bit lines and word lines.

As described above, in embodiments memory cells are vertically disposed at each intersection between a bit line and a word line. FIG. 4E depicts decoder module 400 with bit lines $B_0$, $B_1$, $B_2$, . . . $B_{15}$, and word lines $W_{10}$, $W_{01}$, . . . , $W_{07}$ of Story 0. To avoid overcrowding the drawing, word lines $W_{10}$, $W_{11}$, . . . , $W_{17}$ of Story 1, word line decoders $\mathrm{WLD}\mathbf{0}_{S1}$ and $\mathrm{WLD}\mathbf{1}_{S1}$, word line hookup regions 402 and bit line hookup regions 404 have been omitted. Memory cell locations are indicated with a circular dot at the intersection of word lines and bit lines.

Figure 4F:
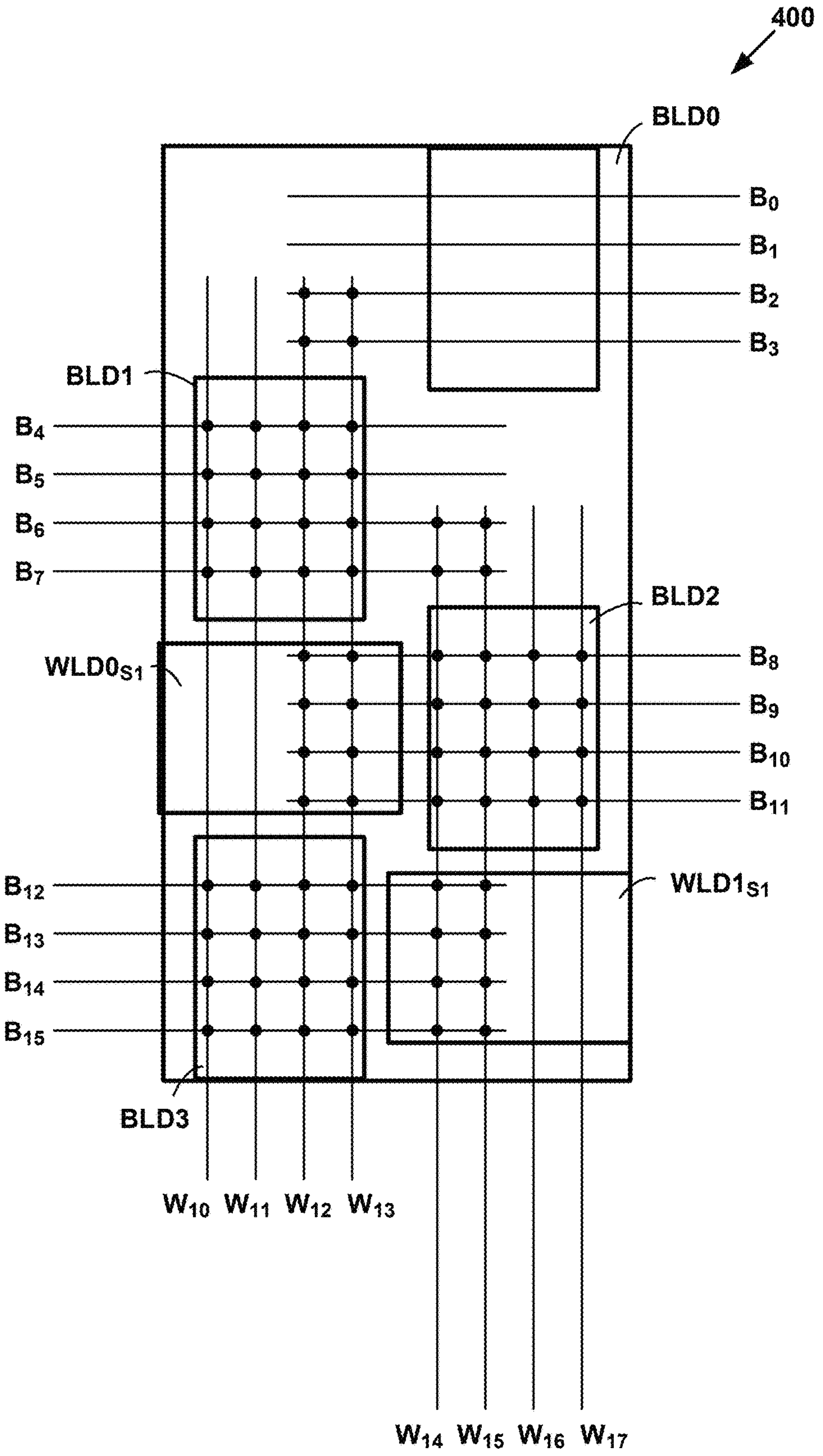
FIG. 4F depicts the example decoder module of FIG. B with a second set of bit lines and word lines.

FIG. 4F depicts decoder module 400 with bit lines $B_0$, $B_1$, $B_2$, . . . $B_{15}$, and word lines $W_{10}$, $W_{11}$, . . . , $W_{17}$ of Story 1. To avoid overcrowding the drawing, word lines $W_{00}$, $W_{01}$, . . . , $W_{07}$ of Story 0, word line decoders $\mathrm{WLD}\mathbf{0}_{S0}$ and $\mathrm{WLD}\mathbf{1}_{S0}$, word line hookup regions 402 and bit line hookup regions 404 have been omitted. Memory cell locations are indicated with a circular dot at the intersection of word lines and bit lines.

As described above, with $N_{WL}=4$ and $N_{BL}=4$, decoder module 400 of FIG. 4B is coupled to 16 bit lines and 16 word lines, and thus can address 128 memory cells in Story 0 and 128 memory cells in Story 1. As depicted in FIGS. 4E and 4F, however, the address space of decoder module 400 includes only 72 memory cells in Story 0 and only 72 memory cells in Story 1 that are located within the boundary of decoder module 400. The remaining 56 memory cells in Story 0 and 56 memory cells in Story 1 are located outside the boundary of decoder module 400.

Figure 4G:
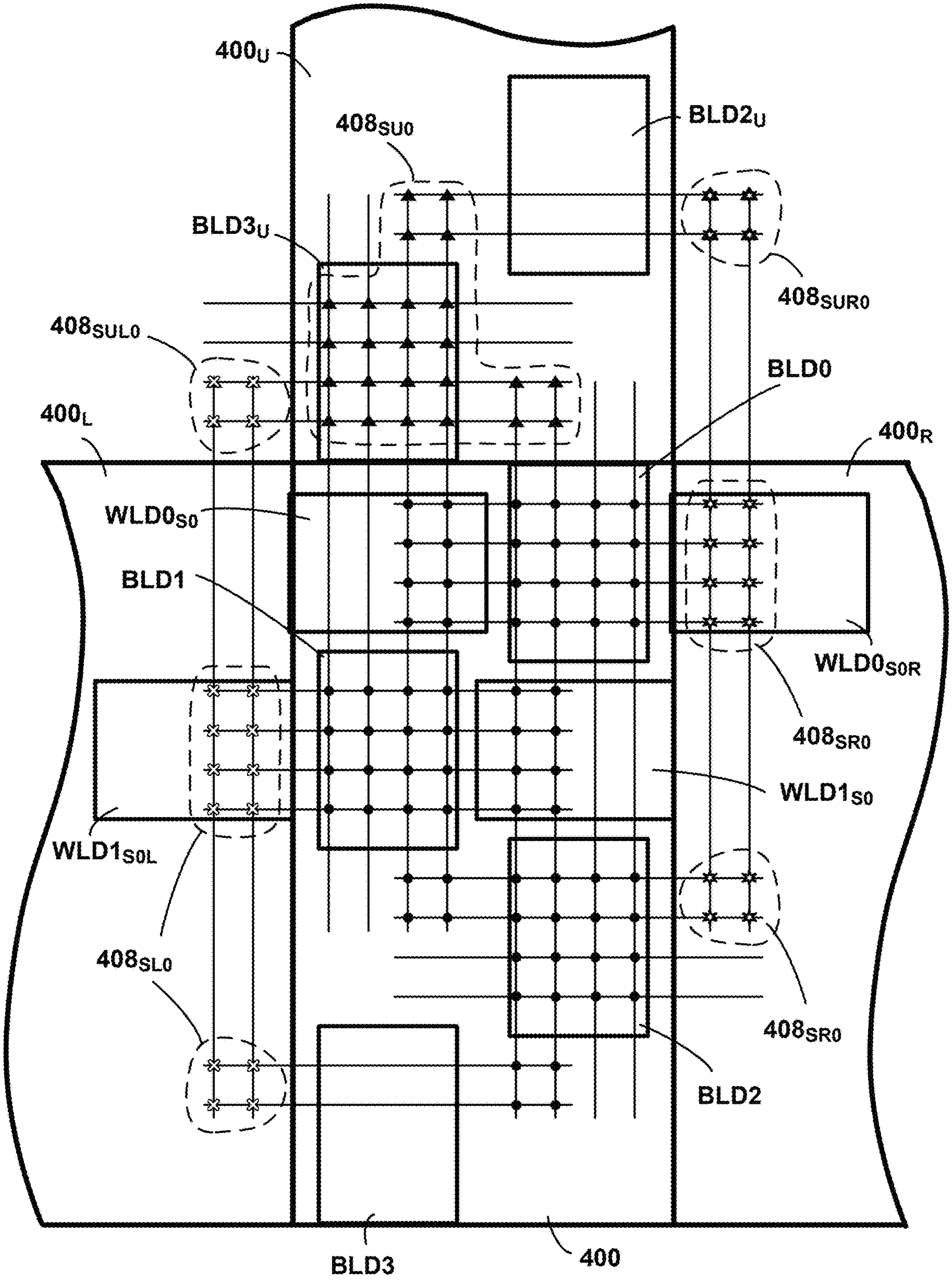
FIG. 4G depicts a portion of an address space of the example decoder module of FIG. 4B.
Figure 4H:
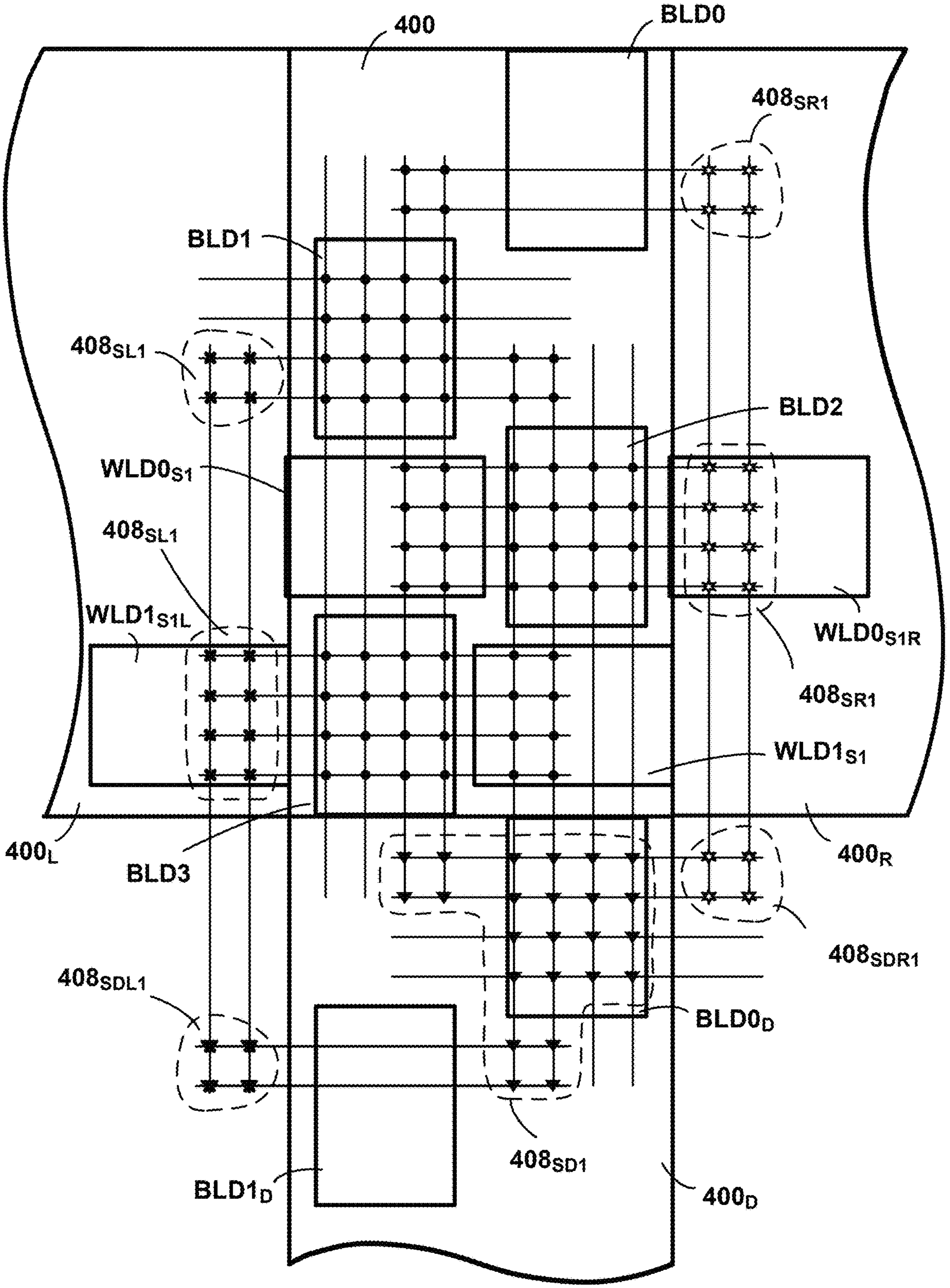
FIG. 4H depicts another portion of an address space of the example decoder module of FIG. 4B.

FIG. 4G depicts the entire Story 0 address space of decoder module 400, and FIG. 4H depicts the entire Story 1 address space of decoder module 400. In particular, FIG. 4G depicts decoder module 400 with portions of adjacent decoder module $\mathbf{400}_L$ to the left of decoder module 400, portions of adjacent decoder module $\mathbf{400}_R$ to the right of decoder module 400, and portions of adjacent decoder module $\mathbf{400}_U$ above decoder module 400. Likewise, FIG. 4H depicts decoder module 400 with portions of adjacent decoder module $\mathbf{400}_L$ to the left of decoder module 400, portions of adjacent decoder module $\mathbf{400}_R$ to the right of decoder module 400, and portions of adjacent decoder module $\mathbf{400}_D$ below decoder module 400. In an embodiment, each decoder module 400 uses "shift" operations to access word line decoders and bit line decoders in adjacent decoder modules 400 to address memory cells in Story 0 and Story 1 that are located outside the boundary of decoder module 400.

Referring to FIG. 4G, in an embodiment decoder module 400 uses a shift-left operation to "borrow" word line decoder $\mathrm{WLD}\mathbf{1}_{S0L}$ in decoder module $\mathbf{400}_L$ to access 12 memory cells $\mathbf{408}_{SL0}$, uses a shift-right operation to borrow word line decoder $\mathrm{WLD}\mathbf{0}_{S0R}$ in decoder module $\mathbf{400}_R$ to access 12 memory cells $\mathbf{408}_{SR0}$, uses a shift-up operation to borrow bit line decoders $\mathrm{BLD}\mathbf{3}_U$ and $\mathrm{BLD}\mathbf{2}_U$ in decoder module $\mathbf{400}_U$ to access 24 memory cells $\mathbf{408}_{SU0}$, uses a shift-up-left operation to borrow word line decoder $\mathrm{WLD}\mathbf{1}_{S0L}$ in decoder module $\mathbf{400}_L$ and bit line decoder $\mathbf{BLD3}_U$ in decoder module $\mathbf{400}_U$ to access 4 memory cells $\mathbf{408}_{SUL0}$, and uses a shift-up-right operation to borrow word line decoder $\mathbf{WLD0}_{S0R}$ in decoder module $\mathbf{400}_R$ and bit line decoder $\mathbf{BLD2}_U$ in decoder module $\mathbf{400}_U$ to access 4 memory cells $\mathbf{408}_{SUR0}$, for a total of 56 memory cells in Story 0 that are located outside the boundary of decoder module 400.

Referring to FIG. 4H, in an embodiment decoder module 400 uses a shift-left operation to borrow word line decoder $\mathbf{WLD1}_{S1L}$ in decoder module $\mathbf{400}_L$ to access 12 memory cells $\mathbf{408}_{SL1}$, uses a shift-right operation to borrow word line decoder $\mathbf{WLD0}_{S1R}$ in decoder module $\mathbf{400}_R$ to access 12 memory cells $\mathbf{408}_{SR1}$, uses a shift-down operation to borrow bit line decoders $\mathbf{BLD0}_D$ and $\mathbf{BLD1}_D$ in decoder module $\mathbf{400}_D$ to access 24 memory cells $\mathbf{708}_{SD1}$, uses a shift-down-left operation to borrow word line decoder $\mathbf{WLD1}_{S1L}$ in decoder module $\mathbf{400}_L$ and bit line decoder $\mathbf{BLD1}_D$ in decoder module $\mathbf{400}_D$ to access 4 memory cells $\mathbf{408}_{SDL1}$, and uses a shift-down-right operation to borrow word line decoder $\mathbf{WLD0}_{S1R}$ in decoder module $\mathbf{400}_R$ and bit line decoder $\mathbf{BLD0}_D$ in decoder module $\mathbf{400}_D$ to Access 4 memory cells $\mathbf{408}_{SDR1}$, for a total of 56 memory cells in Story 1 that are located outside the boundary of decoder module 400.

In the embodiment of FIG. 4C, in each of Stories 0 and 1, each memory cell includes a magnetic memory element $M_x$ coupled in series with selector element $S_x$ disposed between a word line and a bit line. In an embodiment, the memory cells may be programmed and read by applying voltages of positive and negative polarities to the bit lines and the word lines. In an embodiment, the required polarities differ for Story 0 memory cells and Story 1 memory cells.

For example, Table 1 below lists example voltage polarities for programming (SET and RESET) and reading the memory cells:

TABLE 1

| Story | SET | RESET | READ |
|---|---|---|---|
| 0 | WL negative<br>BL positive | WL positive<br>BL negative | WL positive<br>BL negative |
| 1 | WL positive<br>BL negative | WL negative<br>BL positive | WL negative<br>BL positive |

Thus, programming and reading memory cells requires that word lines and bit lines be biased to both positive and negative voltages. Thus, in an embodiment each decoder module 400 includes circuitry to bias word line decoders $\mathbf{WLD0}_{S0}$, $\mathbf{WLD1}_{S0}$, $\mathbf{WLD0}_{S1}$ and $\mathbf{WLD1}_{S1}$ and bit line decoders BLD0, BLD1, BLD2 and BLD3 to positive and negative voltages as needed to perform the various memory operations. In an embodiment, the circuitry includes a first multiplexor circuit (referred to herein as a "pos mux") and a second multiplexor circuit (referred to herein as a "neg mux").

In an embodiment, the pos mux is configured to selectively couple one of word line decoders $\mathbf{WLD0}_{S0}$, $\mathbf{WLD1}_{S0}$, $\mathbf{WLD0}_{S1}$ and $\mathbf{WLD1}_{S1}$ or bit line decoders BLD0, BLD1, BLD2 and BLD3 to one or more positive bias voltages. In an embodiment, the neg mux is configured to selectively couple one of word line decoders $\mathbf{WLD0}_{S0}$, $\mathbf{WLD1}_{S0}$, $\mathbf{WLD0}_{S1}$ and $\mathbf{WLD1}_{S1}$ or bit line decoders BLD0, BLD1, BLD2 and BLD3 to one or more negative bias voltages.

In an embodiment a pos mux includes one or more switches and/or transistors that are configured to selectively couple one of word line decoders $\mathbf{WLD0}_{S0}$, $\mathbf{WLD1}_{S0}$, WLD0$S_1$ and $\mathbf{WLD1}_{S1}$ or bit line decoders BLD0, BLD1, BLD2 and BLD3 to a positive bias node. For example, the positive bias node may be a first voltage bus having a positive voltage (e.g., +3.2V or some other positive voltage). Persons of ordinary skill in the art will understand that other types of circuitry may be used as a pos mux.

In an embodiment, a neg mux includes one or more switches and/or transistors that are configured to selectively couple one of word line decoders $\mathbf{WLD0}_{S0}$, $\mathbf{WLD1}_{S0}$, $\mathbf{WLD0}_{S1}$ and $\mathbf{WLD1}_{S1}$ or bit line decoders BLD0, BLD1, BLD2 and BLD3 to a negative bias node. For example, the negative bias node may be a second voltage bus having a negative voltage (e.g., −3.2V or some other negative voltage). Persons of ordinary skill in the art will understand that other types of circuitry may be used as a neg mux.

In an embodiment, the pos mux in each decoder module 400 cannot simultaneously drive a word line decoder $\mathbf{WLD0}_{S0}$, $\mathbf{WLD1}_{S0}$, $\mathbf{WLD0}_{S1}$, $\mathbf{WLD1}_{S1}$ and a bit line decoder BLD0, BLD1, BLD2, BLD3 in the same decoder module 400. In an embodiment, a neg mux cannot simultaneously drive a word line decoder $\mathbf{WLD0}_{S0}$, $\mathbf{WLD1}_{S0}$, $\mathbf{WLD0}_{S1}$, $\mathbf{WLD1}_{S1}$ and a bit line decoder BLD0, BLD1, BLD2, BLD3 in the same decoder module 400.

For memory cells located within the boundaries of two adjacent decoder modules 400, this is not a problem. However, when shifting is used, this can become a problem depending on the location (Story 0 or Story 1) and memory operation being performed on the two memory cells.

Figure 5A:
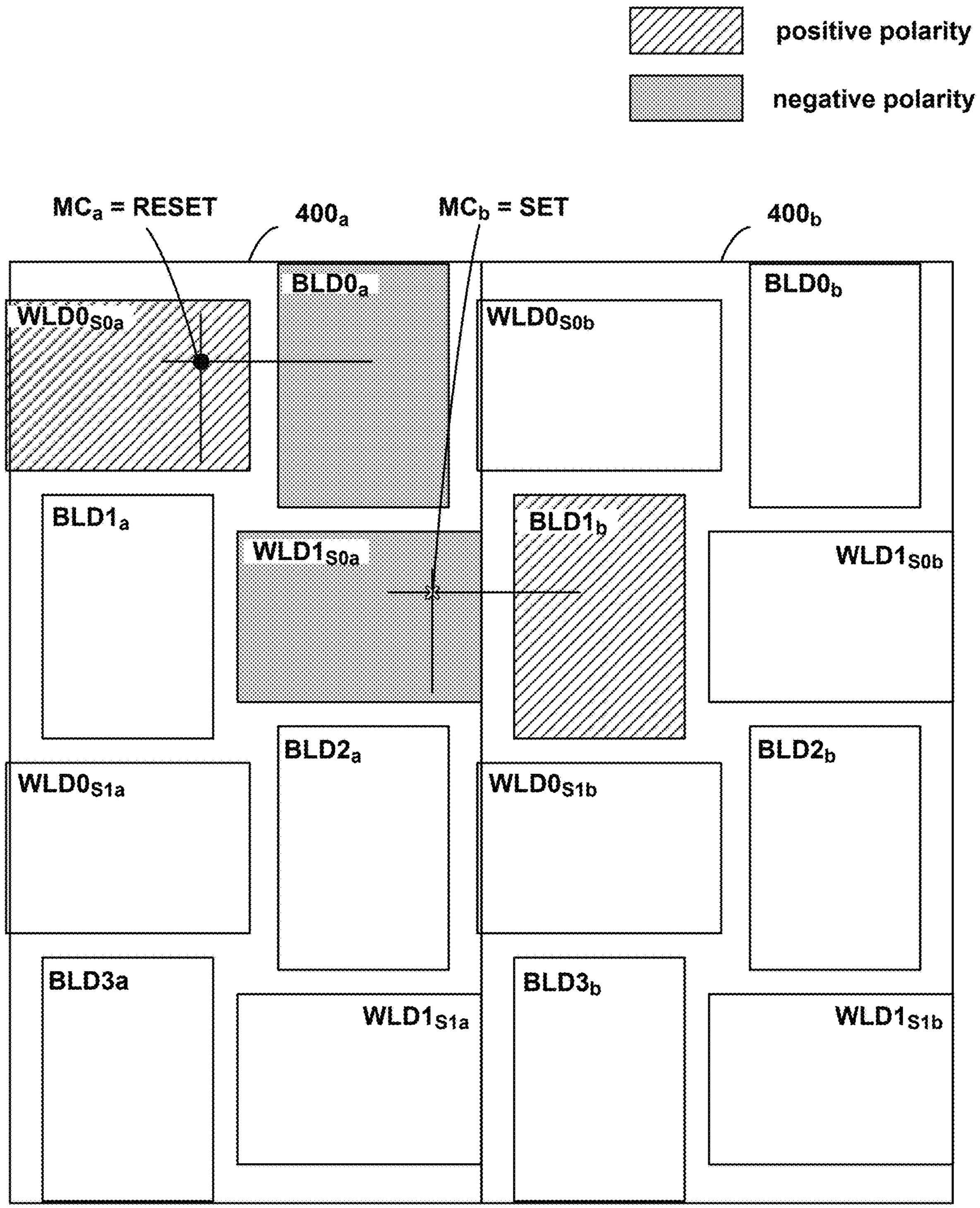
FIG. 5A depicts two adjacent example decoder modules.

For example, FIG. 5A depicts two adjacent decoder modules $\mathbf{400}_a$ and $\mathbf{400}_b$. Decoder module $\mathbf{400}_a$ addresses a selected memory cell $MC_a$ located within the boundary of decoder module $\mathbf{400}_a$, and decoder module $\mathbf{400}_b$ addresses a selected memory cell $MC_b$ located outside the boundary of decoder module $\mathbf{400}_b$. That is, memory cell $MC_b$ is located inside the boundary of decoder module $\mathbf{400}_a$ and is within the address space of decoder module $\mathbf{400}_b$ via a shift-left operation.

In the illustrated example, memory cells $MC_a$ and $MC_b$ are both located in Story 0. In addition, memory cells $MC_a$ and $MC_b$ are selected for simultaneous programming: memory cell $MC_a$ is selected to be RESET and memory cell $MC_b$ is selected to be SET.

From example Table 1, above, RESETTING memory cell $MC_a$ requires coupling the pos mux of decoder module $\mathbf{400}_a$ to word line decoder $\mathbf{WLD0}_{S0a}$ and the neg mux of decoder module $\mathbf{400}_a$ to bit line decoder $\mathbf{BLD0}_a$, and SETTING memory cell $MC_b$ requires coupling the pos mux of decoder module $\mathbf{400}_b$ to bit line decoder $\mathbf{BLD1}_b$ and the neg mux of decoder module $\mathbf{400}_a$ to word line decoder $\mathbf{WLD1}_{S0a}$. This is not permissible, however, because doing so would require that the neg mux of decoder module $\mathbf{400}_a$ simultaneously drive bit line decoder $\mathbf{BLD0}_a$ and word line decoder $\mathbf{WLD1}_{S0a}$.

Figure 5B:
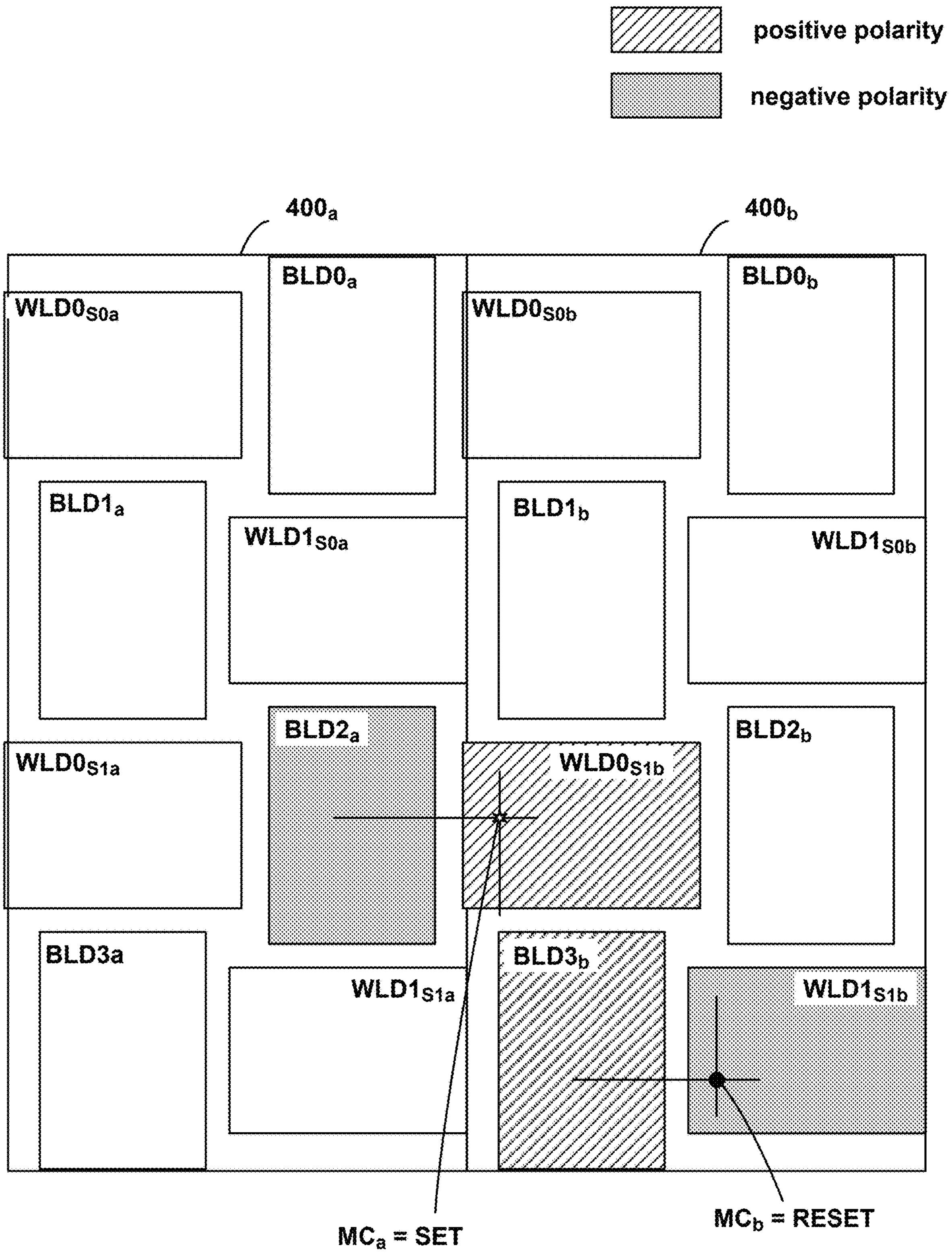
FIG. 5B depicts the decoder modules of FIG. 5A during example memory operations.

In FIG. 5B decoder module $\mathbf{400}_a$ addresses a selected memory cell $MC_a$ located outside the boundary of decoder module$^{400}$a, and decoder module $\mathbf{400}_b$ addresses a selected memory cell $MC_b$ located within the boundary of decoder module $\mathbf{400}_b$. That is, memory cell $MC_a$ is located inside the boundary of decoder module $\mathbf{400}_b$ and is within the address space of decoder module $\mathbf{400}_a$ via a shift-right operation.

In the illustrated example, memory cells $MC_a$ and $MC_b$ are both located in Story 1. In addition, memory cells $MC_a$ and $MC_b$ are selected for simultaneous programming: memory cell $MC_a$ is selected to be SET and memory cell $MC_b$ is selected to be RESET.

From example Table 1, above, SETTING memory cell $MC_a$ requires coupling the pos mux of decoder module $\mathbf{400}_b$ to word line decoder $\mathbf{WLD0}_{S1b}$ and the neg mux of decoder module $\mathbf{400}_a$ to bit line decoder $\mathbf{BLD2}_a$, and RESETTING memory cell $MC_b$ requires coupling the pos mux of decoder module $400_b$ to bit line decoder $BLD3_b$ and the neg mux of decoder module $400_b$ to word line decoder $WLD1_{S1b}$. This is not permissible, however, because doing so would require that the pos mux of decoder module $400_b$ simultaneously drive bit line decoder $BLD3_b$ and word line decoder $WLD1_{S1b}$.

One possible solution to this problem would be to double the number of pos mux and neg mux circuits in each decoder module 400. However, doing so would require increasing the size of decoder modules 400, which is costly and undesirable. Technology is described that accommodates shifting operations such as described above, and does not require that a pos mux or neg mux simultaneously drive two decoders in the same decoder module 400.

Figure 6A:
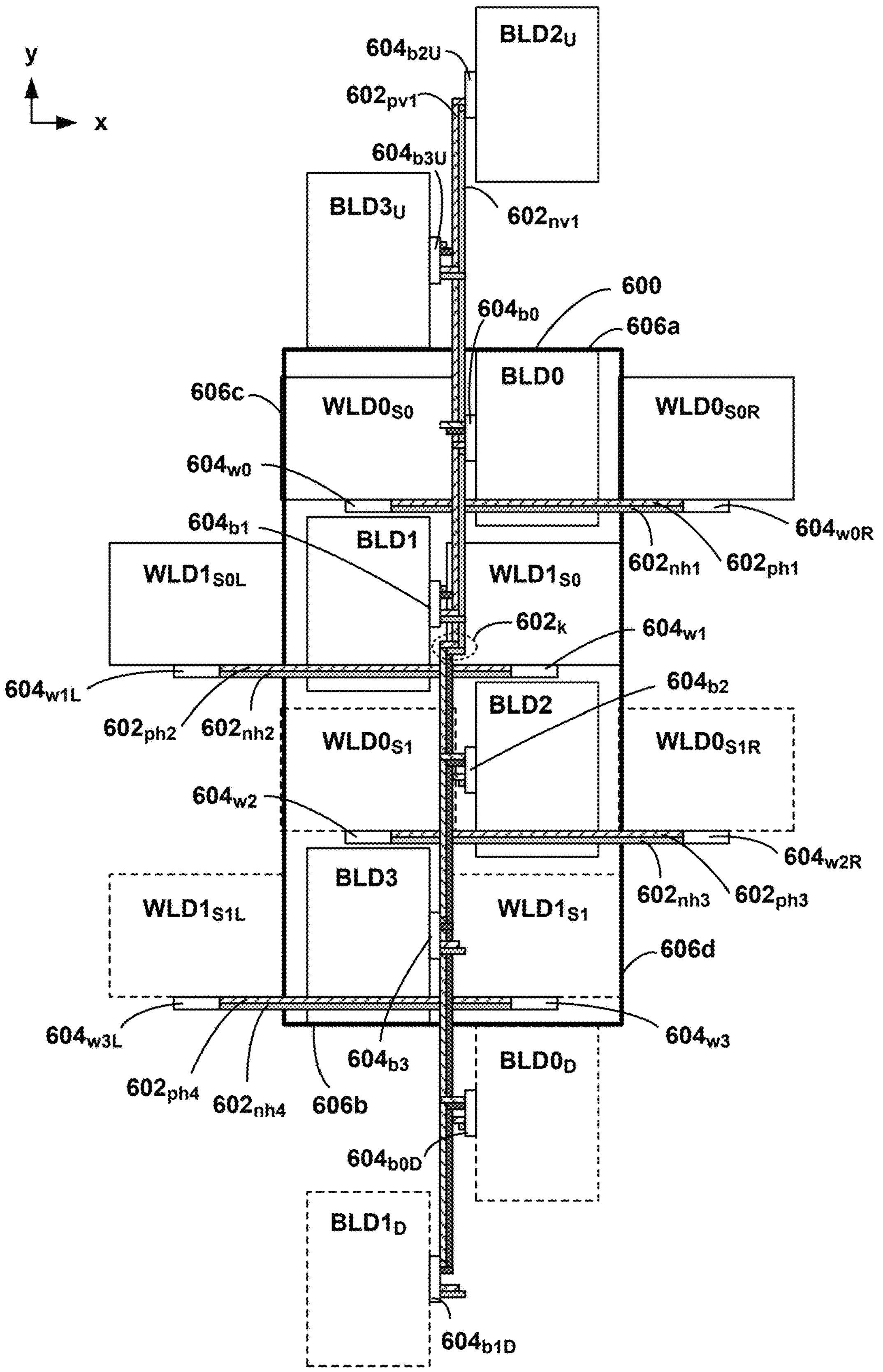
FIGS. 6A-6B depict another example decoder module of word line decoders and bit line decoders.
Figure 6B:
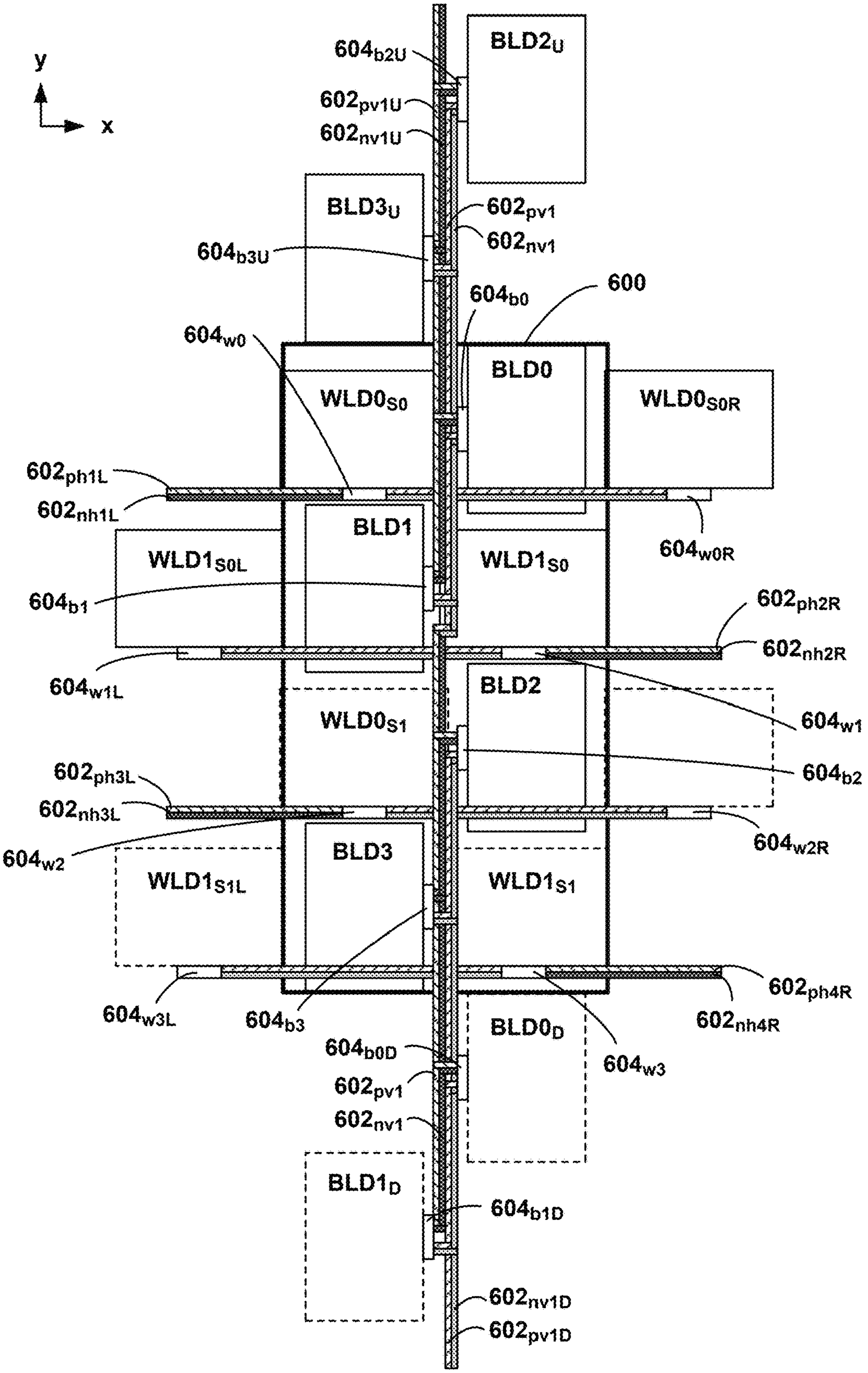

FIGS. 6A-6B depict an embodiment of a decoder module 600 that is similar to decoder module 400 of FIGS. 4A-4H but that may be used with a single pos mux and a single neg mux for performing memory operations on memory cells that use positive and negative polarities, such as memory cells that include magnetic memory elements.

In particular, decoder module 600 includes first number $N_W$=4 word line decoders $WLD0_{S0}$, $WLD1_{S0}$, $WLD0_{S1}$ and $WLD1_{S1}$, and second number $N_B$=4 bit line decoders BLD0, BLD1, BLD2 and BLD3. Persons of ordinary skill in the art will understand that decoder module 600 alternatively may include more than or fewer than 4 word line decoders and 4 bit line decoders. To avoid overcrowding the drawing bit line hookup regions, word line hookup regions, pos mux and neg mux are not depicted in FIGS. 6A-6B.

FIGS. 6A-6B depict decoder module 600 with portions of adjacent decoder modules to the left, right, above and below decoder module 600. In particular, FIGS. 6A-6B depict word line decoders $WLD1_{S0L}$ and $WLD1_{S1L}$ in the adjacent decoder module to the left of decoder module 600, word line decoder $WLD0_{S0R}$ and $WLD0_{S1R}$ in the adjacent decoder module to the right of decoder module 600, bit line decoders $BLD2_U$ and $BLD3_U$ in the adjacent decoder module above decoder module 600, and bit line decoders $BLD0_D$ and $BLD1_D$ in the adjacent decoder module below decoder module 600.

In an embodiment, each decoder module 600 uses shift operations such as described above regarding decoder module 400 to access word line decoders and bit line decoders in adjacent decoder modules to address memory cells in Story 0 and Story 1 that are located outside the boundary of decoder module 600. Decoder module 600 also includes a first bus $602_p$ that is coupled to the pos mux of decoder module 600 and a second bus $602_n$ that is coupled to the neg mux of decoder module 600. In an embodiment, first bus $602_p$ and second bus $602_n$ each include multiple bus segments.

In the embodiment depicted in FIG. 6A, first bus $602_p$ includes five first bus segments: $602_{pv1}$, $602_{ph1}$, $6_{ph2}$, $602_{ph3}$ and $602_{ph4}$, and second bus $602_n$ includes five second bus segments: $602_{nv1}$, $602_{nh1}$, $602_{nh2}$, $602_{nh3}$ and $602_{nh4}$. Persons of ordinary skill in the art will understand that first bus $602_p$ and second bus $602_n$ alternatively may include more or fewer than five bus segments.

In the embodiment of FIG. 6A, first bus segment $602_{pv1}$ and second bus segment $602_{nv1}$ are aligned substantially parallel to the y-axis and first bus segments $602_{ph1}$-$602_{ph4}$ and second bus segments $602_{nh1}$-$602_{nh4}$ are aligned substantially parallel to the x-axis. Persons of ordinary skill in the art will understand that other orientations are possible, and other numbers of bus segments in each orientation are possible. In an embodiment, first bus segment $602_{pv1}$ and second bus segment $602_{nv1}$ include a knee region $602_k$ in which the x-axis position of first bus segment $602_{pv1}$ and second bus segment $602_{nv1}$ shifts to the left. Persons of ordinary skill in the art will understand that other shift arrangements may be used.

Also depicted in FIGS. 6A-6B are selector circuits $604_b$ and $604_w$. In an embodiment, each of bit line decoders BLD0, BLD1, BLD2, and BLD3 in decoder module 600 is coupled to a corresponding selector circuit $604_{b0}$, $604_{b1}$, $604_{b2}$, and $604_{b3}$, respectively. In an embodiment, each of word line decoders $WLD0_{S0}$, $WLD1_{S0}$, $WLD0_{S1}$, and $WLD1_{S1}$, is coupled to a selector circuit $604_{w0}$, $604_{w1}$, $604_{w2}$, and $604_{w3}$, respectively. As described in more detail below, in an embodiment selector circuits $604_{b0}$-$604_{b3}$ and $604_{w0}$-$604_{w3}$ are configured to selectively couple first bus $602_p$ and second bus $602_n$ to bit line decoders BLD0-BLD3 and word line decoders $WLD0_{S0}$-$WLD1_{S1}$, respectively.

In an embodiment, decoder module 600 has a first (e.g., upper) boundary 606*a*, a second (e.g., lower) boundary 606*b*, a third (e.g., left) boundary 606*c*, and a fourth (e.g., right) boundary 606*d*. In an embodiment, first bus $602_p$ and second bus $602_n$ extend beyond one or more boundaries of decoder module 600 and extend into one or more adjacent decoder modules located to the left, to the right, above and below decoder module 600.

In an embodiment, first bus segment $602_{pv1}$ and second bus segment $602_{nv1}$ extend beyond upper boundary 606*a* and lower boundary 606*b*, and extend into adjacent decoder modules disposed above and below, respectively, decoder module 600. In an embodiment, first bus segment $602_{pv1}$ and second bus segment $602_{nv1}$ extend to and are coupled to bit line decoders $BLD2_U$ and $BLD3_U$ in the adjacent decoder module above decoder module 600, and also extend to and are coupled to bit line decoders $BLD0_D$ and $BLD1_D$ in the adjacent decoder module below decoder module 600.

In an embodiment, first bus segment $602_{pv1}$ and second bus segment $602_{nv1}$ extend to and are coupled to selector circuits $604_{b2U}$ and $604_{b3U}$ that are coupled to bit line decoders $BLD2_U$ and $BLD3_U$, respectively, in the adjacent decoder module above decoder module 600, and also extend to and are coupled to selector circuits $604_{b0D}$ and $604_{b1D}$ that are coupled to bit line decoders $BLD0_D$ and $BLD1_D$, respectively, in the adjacent decoder module below decoder module 600.

In an embodiment, first bus segment $602_{ph1}$ and second bus segment $602_{nh1}$ extend to and are coupled to word line decoder $WLD0S_{0R}$ in the adjacent decoder module to the right of decoder module 600. In an embodiment, first bus segment $602_{ph1}$ and second bus segment $602_{nh1}$ extend to and are coupled to selector circuit $604_{w0R}$ that is coupled to word line decoder $WLD0_{S0R}$ in the adjacent decoder module to the right of decoder module 600.

In an embodiment, first bus segment $602_{ph2}$ and second bus segment $602_{nh2}$ extend to and are coupled to word line decoder $WLD1_{S0L}$ in the adjacent decoder module to the left of decoder module 600. In an embodiment, first bus segment $602_{ph2}$ and second bus segment $602_{nh2}$ extend to and are coupled to selector circuit $604_{w1L}$ that is coupled to word line decoder $WLD1_{S0L}$ in the adjacent decoder module to the left of decoder module 600.

In an embodiment, first bus segment $602_{ph3}$ and second bus segment $602_{nh3}$ extend to and are coupled to word line decoder $WLD0_{S1R}$ in the adjacent decoder module to the right of decoder module 600. In an embodiment, first bus segment $602_{ph3}$ and second bus segment $602_{nh3}$ extend to and are coupled to selector circuit $604_{w2R}$ that is coupled to word line decoder WLD$\mathbf{0}_{S1R}$ in the adjacent decoder module to the right of decoder module 600.

In an embodiment, first bus segment $\mathbf{602}_{ph4}$ and second bus segment $\mathbf{602}_{nh4}$ extend to and are coupled to word line decoder WLD$\mathbf{1}_{S1L}$ in the adjacent decoder module to the left of decoder module 600. In an embodiment, first bus segment $\mathbf{602}_{ph4}$ and second bus segment $\mathbf{602}_{nh4}$ extend to and are coupled to selector circuit $\mathbf{604}_{w3L}$ that is coupled to word line decoder WLD$\mathbf{1}_{S1L}$ in the adjacent decoder module to the left of decoder module 600.

Just as decoder module 600 includes first bus $\mathbf{602}_p$ and second bus $\mathbf{602}_n$ that extend into the boundaries of adjacent decoder modules located to the left, to the right, above and below decoder module 600, the adjacent decoder modules located to the left, to the right, above and below decoder module 600 each include corresponding first buses $\mathbf{602}_p$ and second buses $\mathbf{602}_n$ that extend into the boundaries of decoder module 600.

Indeed, FIG. 6B illustrates first bus segment $\mathbf{602}_{pv1U}$ and second bus segment $\mathbf{602}_{nv1U}$ extend from the adjacent decoder module above decoder module 600, and are coupled to bit line decoders BLDG and BLD1 in decoder module 600, and bit line decoders BLD$\mathbf{2}_U$ and BLD$\mathbf{3}_U$ in the adjacent decoder module above decoder module 600.

In an embodiment, first bus segment $\mathbf{602}_{pv1U}$ and second bus segment $\mathbf{602}_{nv1U}$ are coupled to selector circuits $\mathbf{604}_{b0}$ and $\mathbf{604}_{b1}$ in decoder module 600. In an embodiment, selector circuits $\mathbf{604}_{b0}$ and $\mathbf{604}_{b1}$ are configured to selectively couple first bus segment $\mathbf{602}_{pv1U}$ and second bus segment $\mathbf{602}_{nv1U}$ and first bus segment $\mathbf{602}_{pv1}$ and second bus segment $\mathbf{602}_{nv1}$ to bit line decoders BLD0 and BLD1 in decoder module 600.

In an embodiment, first bus segment $\mathbf{602}_{pv1}$ and second bus segment $\mathbf{602}_{nv1}$ are coupled to selector circuits $\mathbf{604}_{b2U}$ and $\mathbf{604}_{b3U}$ in the decoder module above decoder module 600. In an embodiment, selector circuits $\mathbf{604}_{b2U}$ and $\mathbf{604}_{b3U}$ are configured to selectively couple first bus segment $\mathbf{602}_{pv1U}$ and second bus segment $\mathbf{602}_{nv1U}$ and first bus segment $\mathbf{602}_{pv1}$ and second bus segment $\mathbf{602}_{nv1}$ to bit line decoders BLD$\mathbf{2}_U$ and BLD$\mathbf{3}_U$ in the decoder module above decoder module 600.

In an embodiment, first bus segment $\mathbf{602}_{ph1L}$ and second bus segment $\mathbf{602}_{nh1L}$ extend from the adjacent decoder module to the left of decoder module 600, and are coupled to selector circuit $\mathbf{604}_{w0}$. In an embodiment, selector circuit $\mathbf{604}_{w0}$ is configured to selectively couple first bus segment $\mathbf{602}_{ph1L}$ and second bus segment $\mathbf{602}_{nh1L}$ and first bus segment $\mathbf{602}_{ph1}$ and second bus segment $\mathbf{602}_{nh1}$ to word line decoder WLD$\mathbf{0}_{S0}$ in decoder module 600.

In an embodiment, first bus segment $\mathbf{602}_{ph2R}$ and second bus segment $\mathbf{602}_{nh2R}$ extend from the adjacent decoder module to the right of decoder module 600, and are coupled to selector circuit $\mathbf{604}_{w1}$. In an embodiment, selector circuit $\mathbf{604}_{w1}$ is configured to selectively couple first bus segment $\mathbf{602}_{ph2}$ and second bus segment $\mathbf{602}_{nh2}$ and first bus segment $\mathbf{602}_{ph2R}$ and second bus segment $\mathbf{602}_{nh2R}$ to word line decoder WLD$\mathbf{1}_{S0}$ in decoder module 600.

In an embodiment, first bus segment $\mathbf{602}_{ph3L}$ and second bus segment $\mathbf{602}_{nh3L}$ extend from the adjacent decoder module to the left of decoder module 600, and are coupled to selector circuit $\mathbf{604}_{w2}$. In an embodiment, selector circuit $\mathbf{604}_{w2}$ is configured to selectively couple first bus segment $\mathbf{602}_{ph3L}$ and second bus segment $\mathbf{602}_{nh3L}$ and first bus segment $\mathbf{602}_{ph3}$ and second bus segment $\mathbf{602}_{nh3}$ to word line decoder WLD$\mathbf{0}_{S1}$ in decoder module 600.

In an embodiment, first bus segment $\mathbf{602}_{ph4R}$ and second bus segment $\mathbf{602}_{nh4R}$ extend from the adjacent decoder module to the right of decoder module 600, and are coupled to selector circuit $\mathbf{604}_{w3}$. In an embodiment, selector circuit $\mathbf{604}_{w3}$ is configured to selectively couple first bus segment $\mathbf{602}_{ph4}$ and second bus segment $\mathbf{602}_{nh4}$ and first bus segment $\mathbf{602}_{ph4R}$ and second bus segment $\mathbf{602}_{nh4R}$ to word line decoder WLD$\mathbf{1}_{S1}$ in decoder module 600.

In an embodiment, first bus segment $\mathbf{602}_{pv1D}$ and second bus segment $\mathbf{602}_{nv1D}$ extend from the adjacent decoder module below decoder module 600, and are coupled to bit line decoders BLD2 and BLD3 in decoder module 600, and bit line decoders BLD$\mathbf{0}_D$ and BLD$\mathbf{1}_D$ in the adjacent decoder module below decoder module 600.

In an embodiment, first bus segment $\mathbf{602}_{pv1D}$ and second bus segment $\mathbf{602}_{nv1D}$ are coupled to selector circuits $\mathbf{604}_{b2}$ and $\mathbf{604}_{b3}$ in decoder module 600. In an embodiment, selector circuits $\mathbf{604}_{b2}$ and $\mathbf{604}_{b3}$ are configured to selectively couple first bus segment $\mathbf{602}_{pv1D}$ and second bus segment $\mathbf{602}_{nv1D}$ and first bus segment $\mathbf{602}_{pv1}$ and second bus segment $\mathbf{602}_{nv1}$ to bit line decoders BLD2 and BLD3 in decoder module 600.

In an embodiment, first bus segment $\mathbf{602}_{pv1}$ and second bus segment $\mathbf{602}_{nv1}$ are coupled to selector circuits $\mathbf{604}_{b0D}$ and $\mathbf{604}_{b1D}$ in the decoder module below decoder module 600. In an embodiment, selector circuits $\mathbf{604}_{b0D}$ and $\mathbf{604}_{b1D}$ are configured to selectively couple first bus segment $\mathbf{602}_{pv1D}$ and second bus segment $\mathbf{602}_{nv1D}$ and first bus segment $\mathbf{602}_{pv1}$ and second bus segment $\mathbf{602}_{nv1}$ to bit line decoders BLD$\mathbf{0}_D$ and BLD$\mathbf{1}_D$ in the decoder module below decoder module 600.

Figure 6C:
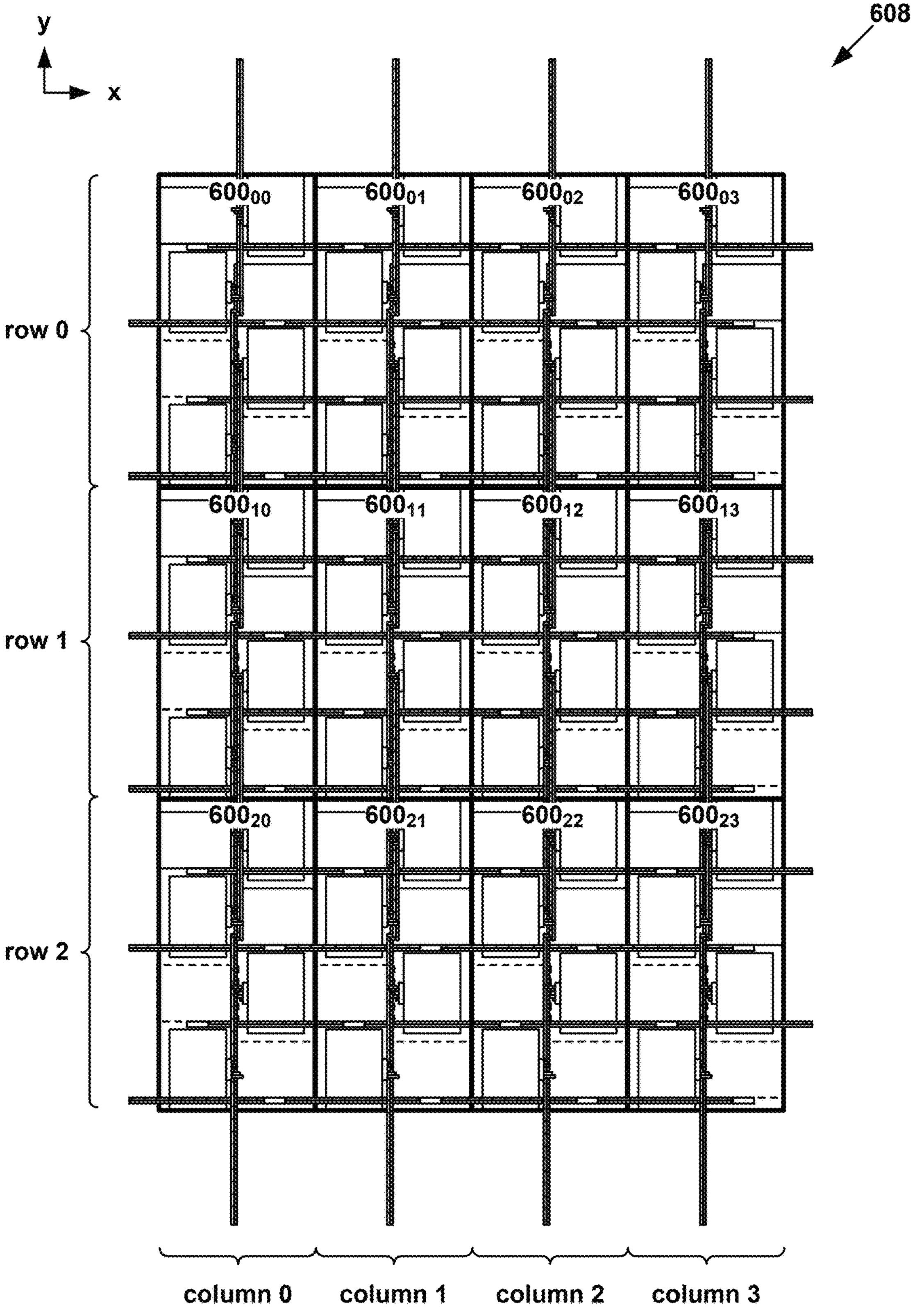
FIG. 6C is a diagram of an array of three rows and four columns of decoder modules of FIG. 6A.

Example decoder module 600 may be used in an array of decoder modules, such as described above regarding array 406 of FIG. 4D. For example, FIG. 6C is a diagram of an array of three rows and four columns of decoder modules $\mathbf{600}_{00}$, $\mathbf{600}_{01}$, $\mathbf{600}_{02}$, . . . , $\mathbf{600}_{22}$, $\mathbf{600}_{23}$, each a replica of decoder module 600 of FIG. 6A. Persons of ordinary skill in the art will understand that arrays may include more or less than three rows and four columns of decoder modules 600.

Figure 7A:
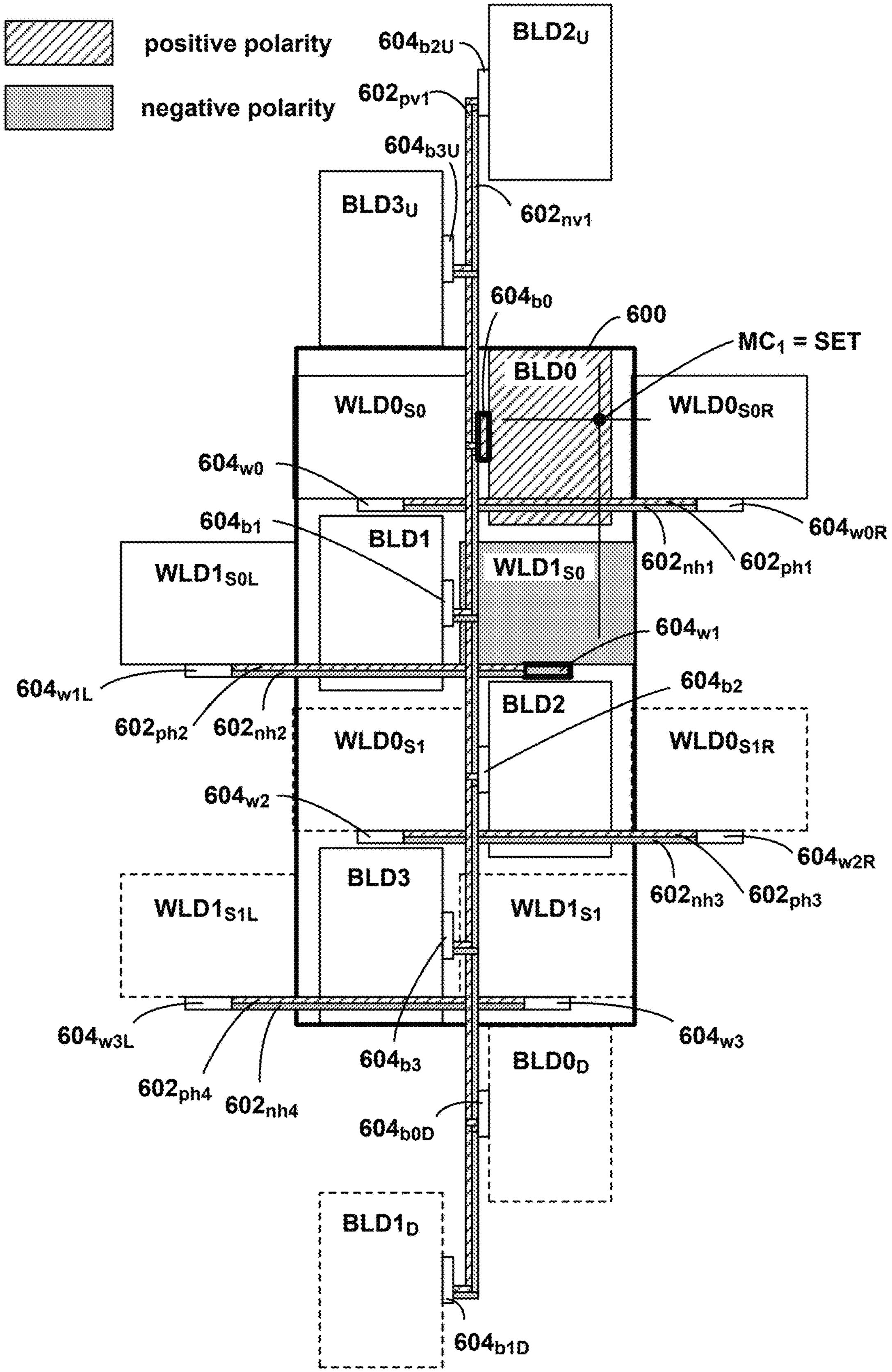
FIG. 7A is an example programming operation of a memory cell that is located within the boundary of the example decoder module of FIGS. 6A-6B.

FIG. 7A is a diagram of decoder module 600 during an example SET operation of a memory cell $MC_1$ that is located in Story 0 within the boundary of decoder module 600. Memory cell $MC_1$ is addressable by decoder module 600 without a shift operation. In an embodiment, selector circuit $\mathbf{604}_{b0}$ selectively couples first bus segment $\mathbf{602}_{pv1}$ to bit line decoder BLD0, and selector circuit $\mathbf{604}_{w1}$ selectively couples second bus segment $\mathbf{602}_{nh2}$ to word line decoder WLD$\mathbf{1}_{S0}$. Thus, the pos mux of decoder module 600 is coupled to bit line decoder BLDG and the neg mux of decoder module 600 is coupled to word line decoder WLD$\mathbf{1}_{S0}$.

Figure 7B:
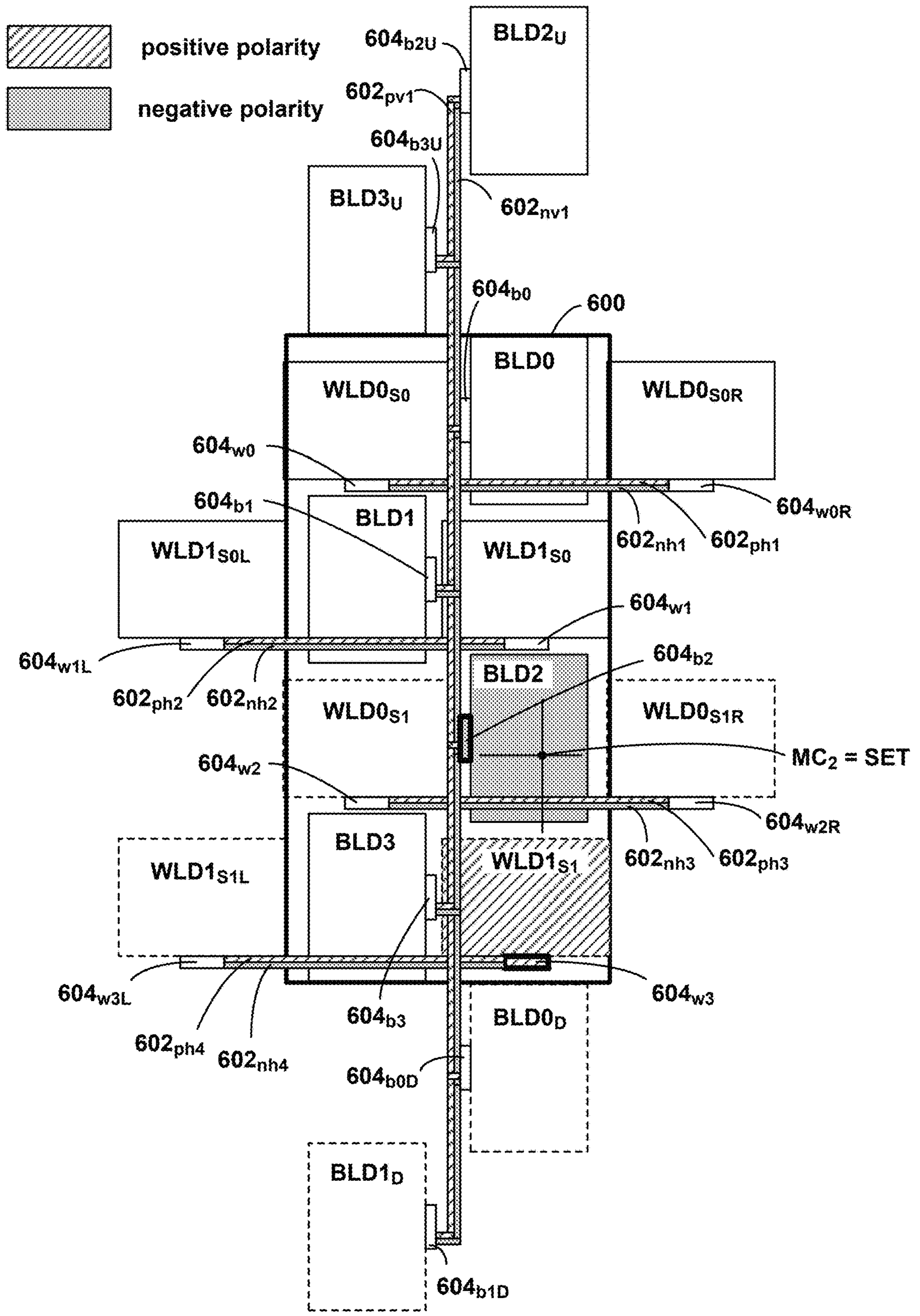
FIG. 7B depicts another example programming operation of a memory cell that is located within the boundary of the example decoder module of FIGS. 6A-6B

FIG. 7B is a diagram of decoder module 600 during an example SET operation of a memory cell $MC_2$ that is located in Story 1 within the boundary of decoder module 600. Memory cell $MC_2$ is addressable by decoder module 600 without a shift operation. In an embodiment, selector circuit $\mathbf{604}_{b2}$ selectively couples second bus segment $\mathbf{602}_{nv1}$ to bit line decoder BLD2, and selector circuit $\mathbf{604}_{w3}$ selectively couples first bus segment $\mathbf{602}_{ph4}$ to word line decoder WLD$\mathbf{1}_{S1}$. Thus, the neg mux of decoder module 600 is coupled to bit line decoder BLD2 and the pos mux of decoder module 600 is coupled to word line decoder WLD$\mathbf{1}_{S1}$.

Figure 7C:
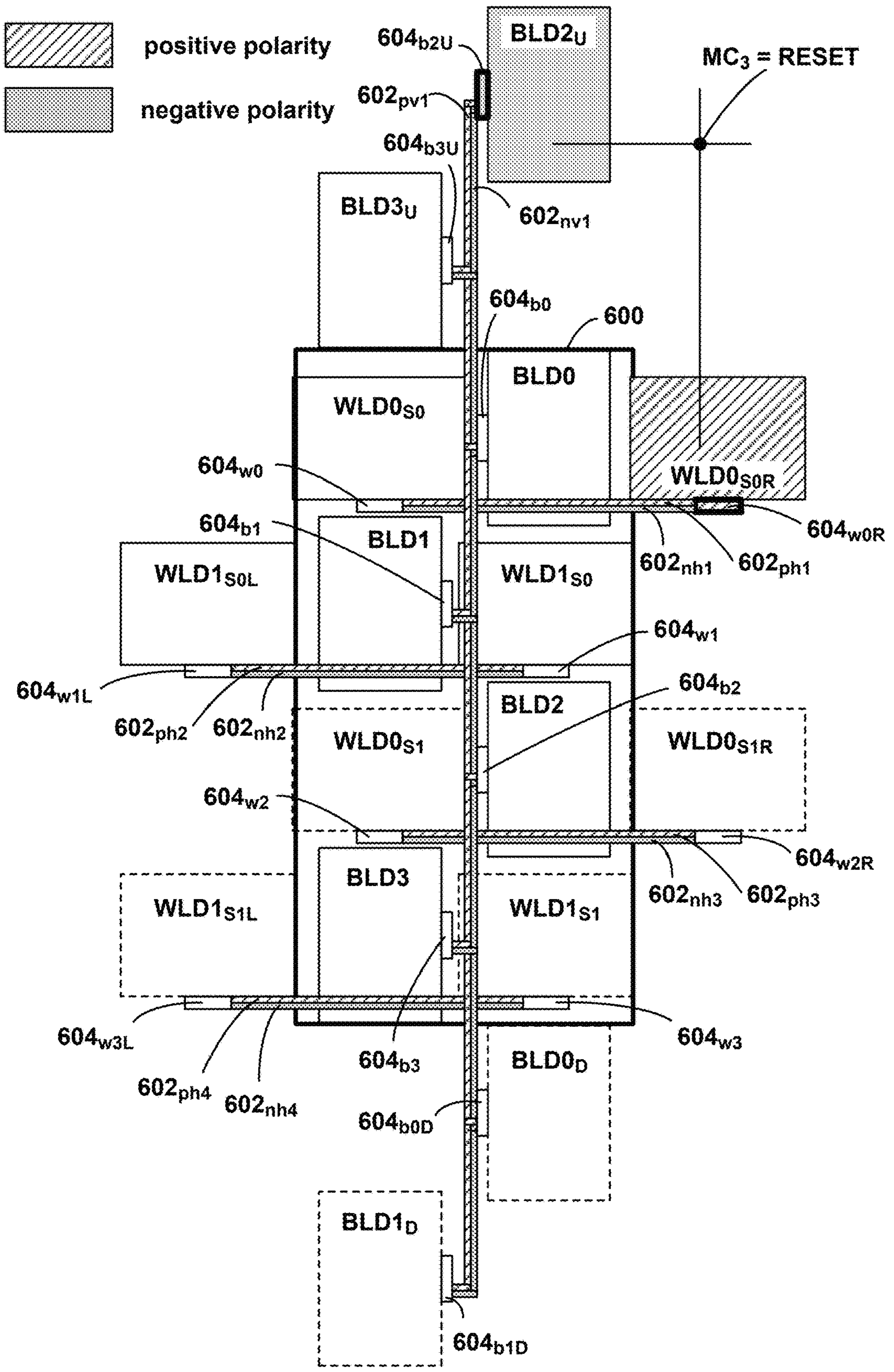
FIG. 7C depicts an example programming operation of a memory cell that is located outside the boundary of the example decoder module of FIGS. 6A-6B.

FIG. 7C is a diagram of decoder module 600 during an example RESET operation of a memory cell $MC_3$ that is located in Story 0 outside the boundary of decoder module 600. Memory cell $MC_3$ is addressable by decoder module 600 with a shift-up-right operation. In an embodiment, selector circuit $\mathbf{604}_{b2U}$ selectively couples second bus segment $\mathbf{602}_{nv1}$ to bit line decoder BLD$\mathbf{2}_U$ in the decoder module above decoder module 600, and selector circuit $\mathbf{604}_{w0R}$ selectively couples first bus segment $\mathbf{602}_{ph1}$ to word line decoder WLD$\mathbf{0}_{S0R}$ in the decoder module to the right of decoder module 600. Thus, the neg mux of decoder module 600 is coupled to bit line decoder BLD$\mathbf{2}_U$ and the pos mux of decoder module 600 is coupled to word line decoder WLD$\mathbf{0}_{S0R}$.

Figure 7D:
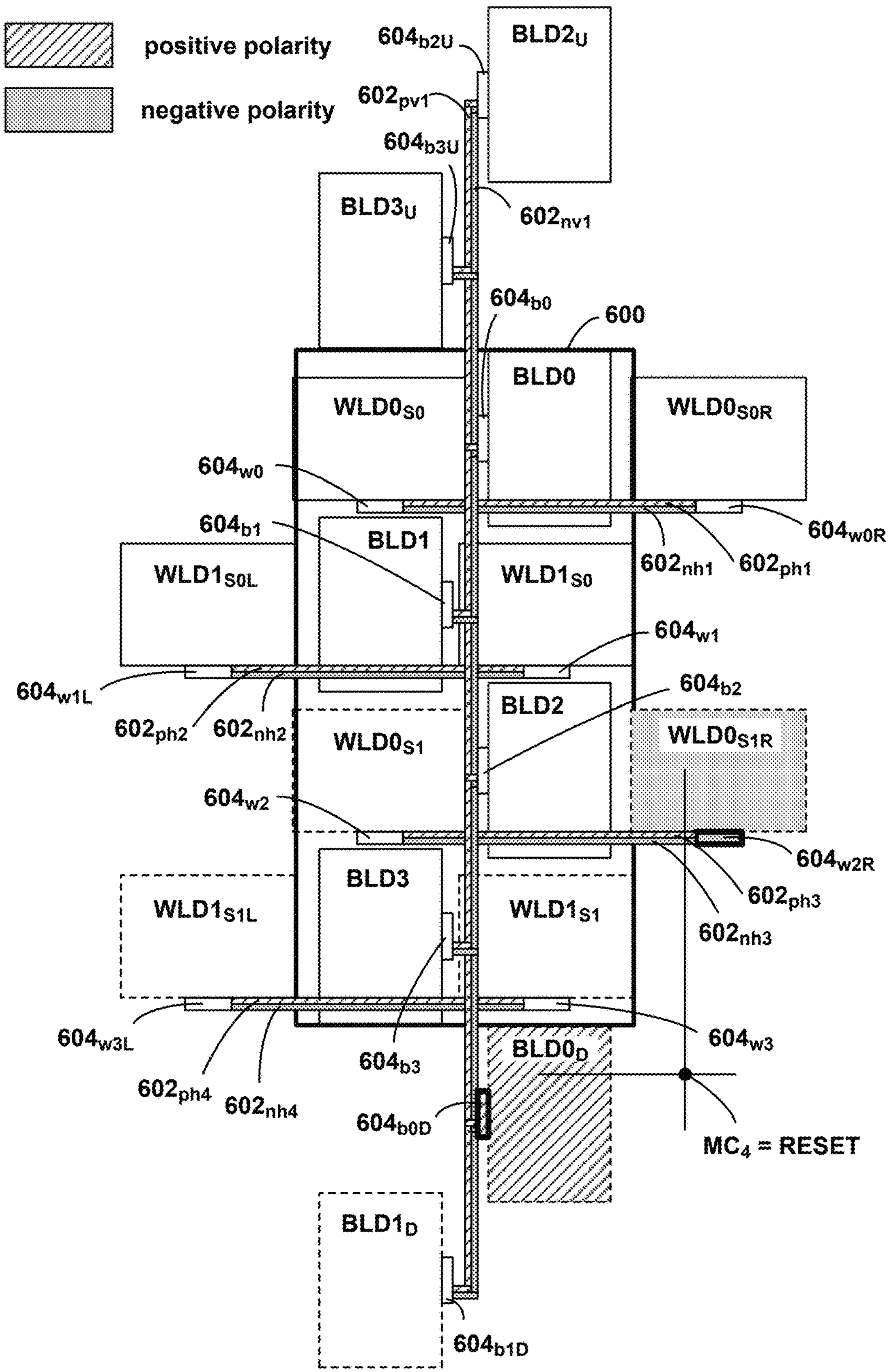
FIG. 7D depicts an example programming operation of another memory cell that is located outside the boundary of the example decoder module of FIGS. 6A-6B.

FIG. 7D is a diagram of decoder module 600 during an example RESET operation of a memory cell $MC_4$ that is located in Story 1 outside the boundary of decoder module 600. Memory cell $MC_4$ is addressable by decoder module 600 with a shift-down-right operation. In an embodiment, selector circuit $\mathbf{604}_{b0D}$ selectively couples first bus segment $\mathbf{602}_{pv1}$ to bit line decoder BLD$\mathbf{0}_D$ in the decoder module below decoder module 600, and selector circuit $\mathbf{604}_{w2R}$ selectively couples second bus segment $\mathbf{602}_{nh3}$ to word line decoder WLD$\mathbf{0}_{S1R}$ in the decoder module to the right of decoder module 600. Thus, the pos mux of decoder module 600 is coupled to bit line decoder BLD$\mathbf{0}_D$ and the neg mux of decoder module 600 is coupled to word line decoder WLD$\mathbf{0}_{S1R}$.

Figure 7E:
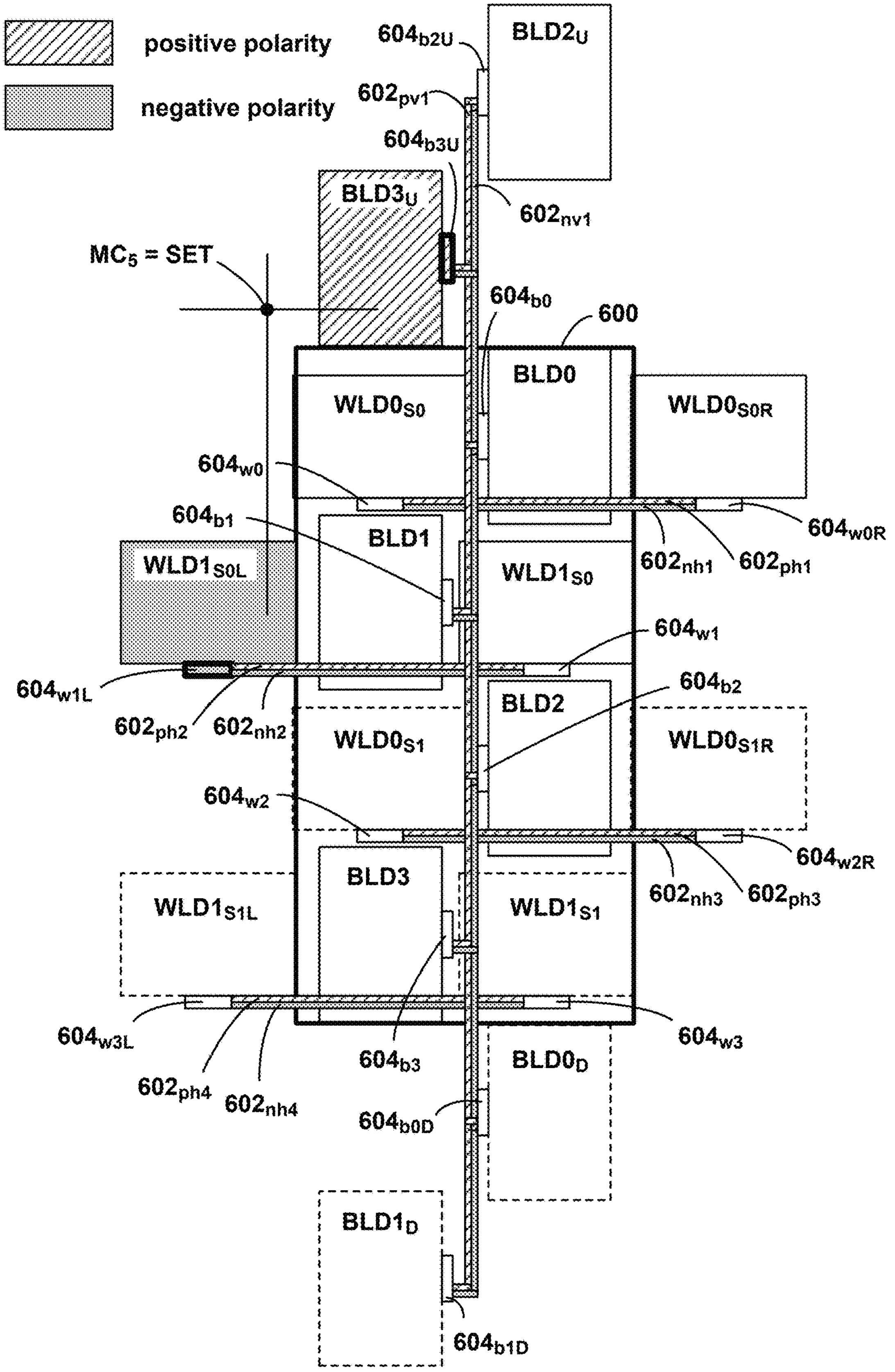
FIG. 7E depicts an example programming operation of still another memory cell that is located outside the boundary of the example decoder module of FIGS. 6A-6B.

FIG. 7E is a diagram of decoder module 600 during an example SET operation of a memory cell $MC_5$ that is located in Story 0 outside the boundary of decoder module 600. Memory cell $MC_5$ is addressable by decoder module 600 with a shift-up-left operation. In an embodiment, selector circuit $\mathbf{604}_{b3U}$ selectively couples first bus segment $\mathbf{602}_{pv1}$ to bit line decoder BLD$\mathbf{3}_U$ in the decoder module above decoder module 600, and selector circuit $\mathbf{604}_{w1L}$ selectively couples second bus segment $\mathbf{602}_{nh2}$ to word line decoder WLD$\mathbf{1}_{S0L}$ in the decoder module to the left of decoder module 600. Thus, the pos mux of decoder module 600 is coupled to bit line decoder BLD$\mathbf{3}_U$ and the neg mux of decoder module 600 is coupled to word line decoder WLD$\mathbf{1}_{S0L}$.

Figure 7F:
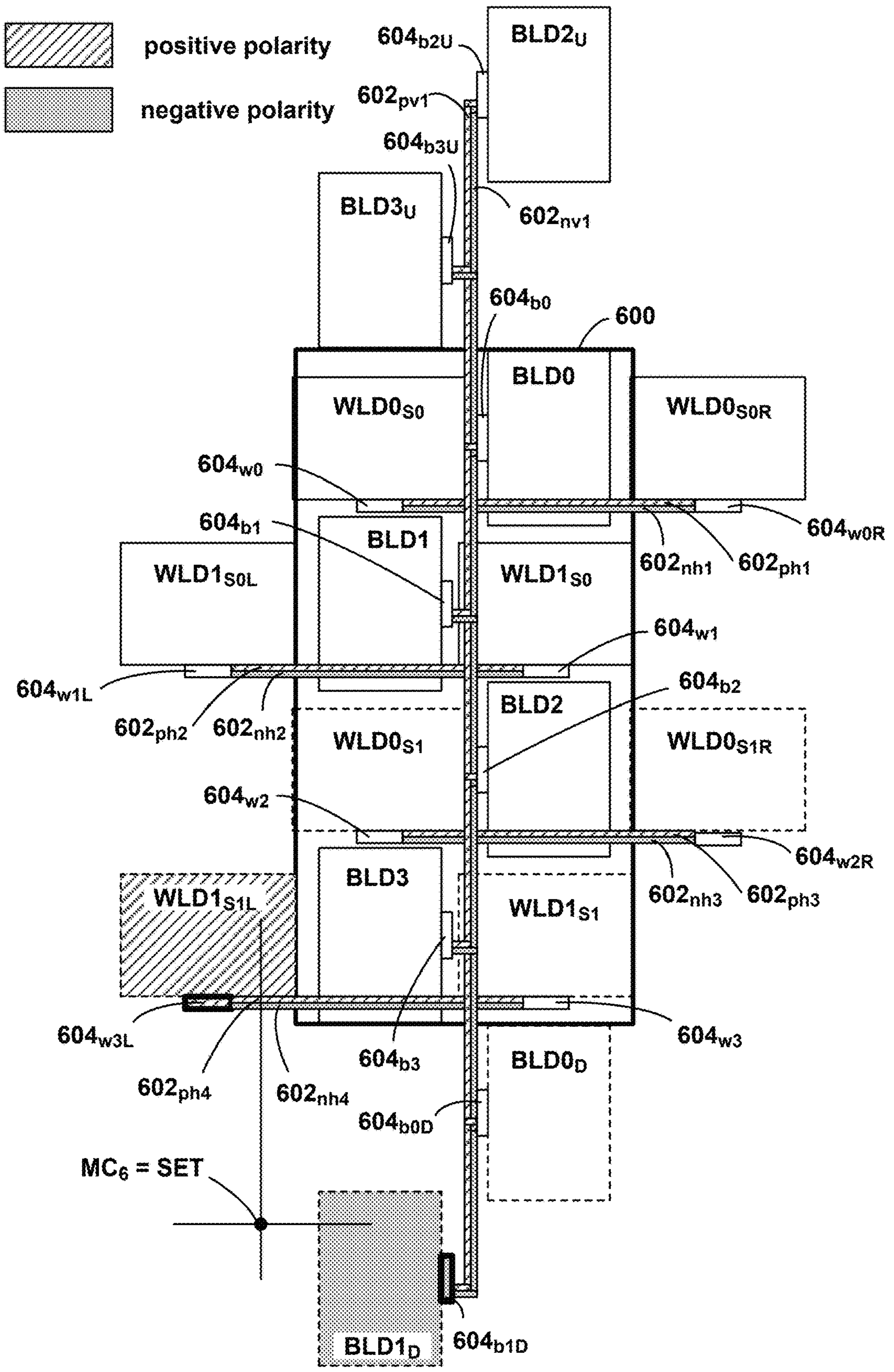
FIG. 7F depicts an example programming operation of yet another memory cell that is located outside the boundary of the example decoder module of FIGS. 6A-6B.

FIG. 7F is a diagram of decoder module 600 during an example SET operation of a memory cell $MC_6$ that is located in Story 1 outside the boundary of decoder module 600. Memory cell $MC_6$ is addressable by decoder module 600 with a shift-down-left operation. In an embodiment, selector circuit $\mathbf{604}_{b1D}$ selectively couples second bus segment $\mathbf{602}_{nv1}$ to bit line decoder BLD$\mathbf{1}_D$ in the decoder module below decoder module 600, and selector circuit $\mathbf{604}_{w3L}$ selectively couples first bus segment $\mathbf{602}_{ph4}$ to word line decoder WLD$\mathbf{1}_{S1L}$ in the decoder module to the left of decoder module 600. Thus, the neg mux of decoder module 600 is coupled to bit line decoder BLD$\mathbf{1}_D$ and the pos mux of decoder module 600 is coupled to word line decoder WLD$\mathbf{1}_{S1L}$.

Figure 7G:
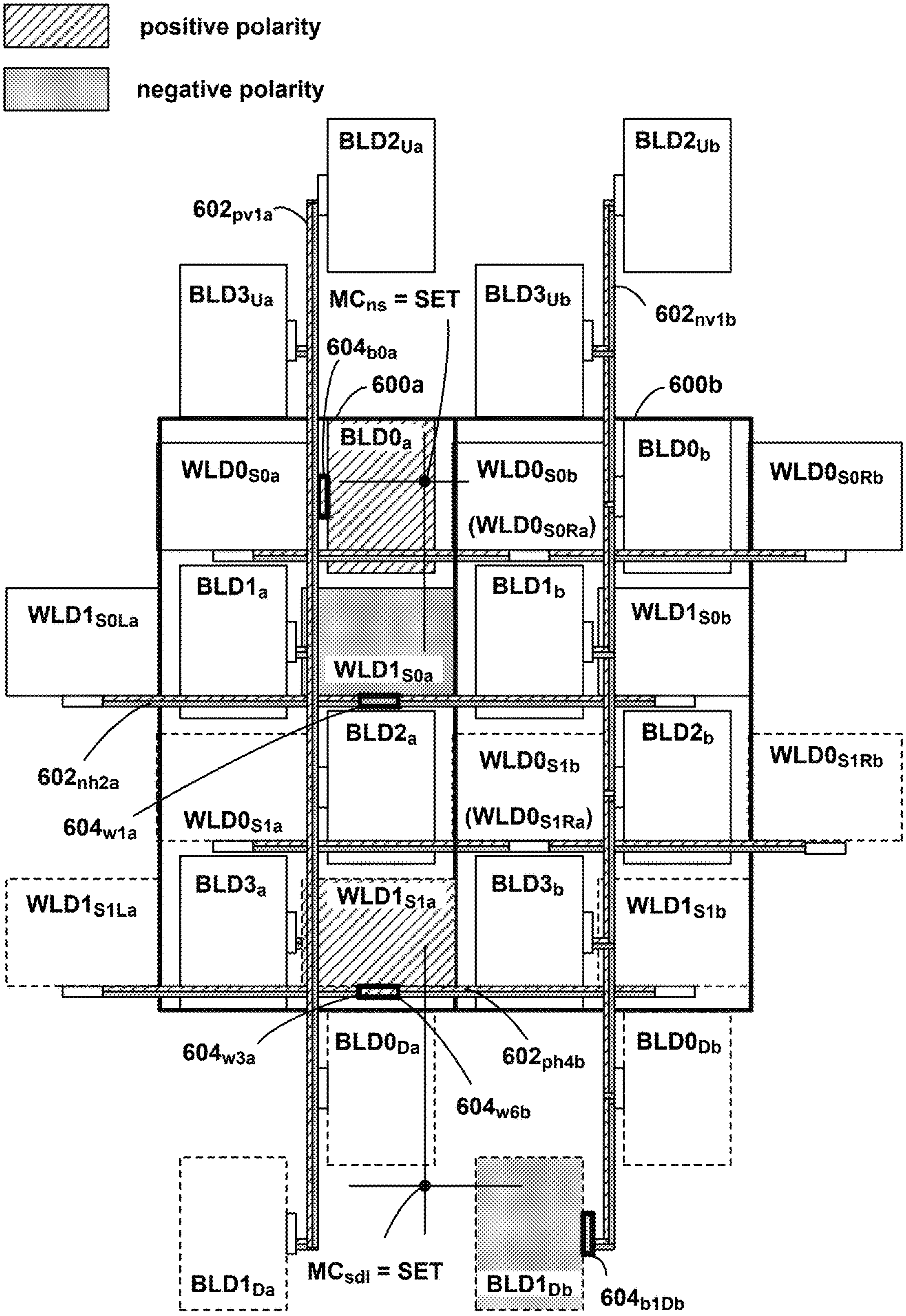
FIG. 7G depicts an example programming operation of two adjacent example decoder modules of FIGS. 6A-6B.

FIG. 7G is a diagram of two adjacent decoder modules 600*a* and 600*b*, with decoder module 600*a* on a left side of decoder module 600*b*, and decoder module 600*b* on a right side of decoder module 600*a*. In this example, decoder module 600*a* performs an example SET operation of a memory cell $MC_{ns}$ that is located in Story 0 within the boundary of decoder module 600*a*, and decoder module 600*b* performs an example SET operation of a memory cell $MC_{ns}$ that is located in Story 1 outside the boundary of decoder module 600*b*.

Memory cell $MC_{ns}$ is addressable by decoder module 600*a* without a shift operation. In an embodiment, selector circuit $\mathbf{604}_{b0a}$ selectively couples first bus segment $\mathbf{602}_{pv1a}$ to bit line decoder BLD$\mathbf{0}_a$, and selector circuit $\mathbf{604}_{w1a}$ selectively couples second bus segment $\mathbf{602}_{nh2a}$ to word line decoder WLD$\mathbf{1}_{S0a}$. Thus, the pos mux of decoder module 600*a* is coupled to bit line decoder BLD$\mathbf{0}_a$ and the neg mux of decoder module 600*a* is coupled to word line decoder WLD$\mathbf{1}_{S0a}$.

Memory cell $MC_{sdl}$ is addressable by decoder module 600*b* with a shift-down-left operation. In an embodiment, selector circuit $\mathbf{604}_{b1Db}$ selectively couples second bus segment $\mathbf{602}_{nv1b}$ to bit line decoder BLD$\mathbf{1}_{Db}$ in the decoder module below decoder module 600*b*, and selector circuit $\mathbf{604}_{w3a}$ of decoder module 600*a* selectively couples first bus segment $\mathbf{602}_{ph4b}$ to word line decoder WLD$\mathbf{1}_{S1a}$ in decoder module 600*a*. Thus, the neg mux of decoder module 600*b* is coupled to bit line decoder BLD$\mathbf{1}_{Db}$ and the pos mux of decoder module 600*b* is coupled to word line decoder WLD$\mathbf{1}_{S1a}$ of decoder module 600*a*.

Thus, in this example, bit line decoder BLD$\mathbf{0}_a$ and word line decoder WLD$\mathbf{1}_{S1a}$ of decoder module 600*a* are simultaneously coupled to a pos mux, but not the same pos mux. Instead, bit line decoder BLD$\mathbf{0}_a$ is coupled to the pos mux of decoder module 600*a* and word line decoder WLD$\mathbf{1}_{S1a}$ is coupled to the pos mux of decoder module 600*b*. Persons of ordinary skill in the art will understand that all other possible combinations of programming and reading operations may be performed using the above described technology.

Without wanting to be bound by any particular theory, it is believed that the described technology may be used with memory arrays that require shift operations and positive and negative polarities, without requiring that a pos mux or a neg mux simultaneously drive a bit line decoder and a word line decoder in the same decoder module.

Figure 8:
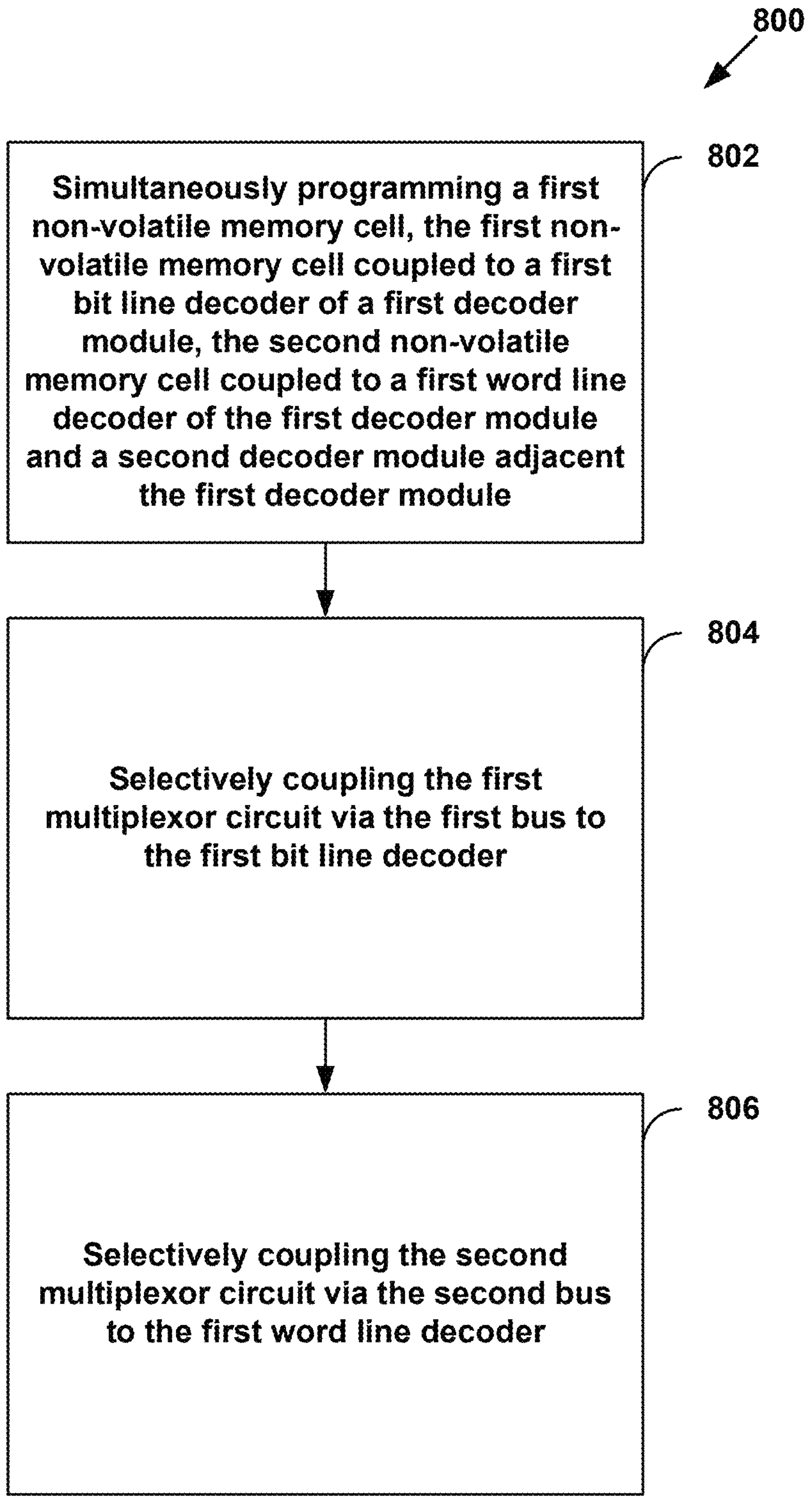
FIG. 8 is a block diagram of a method for simultaneously programming a first non-volatile memory cell and a second non-volatile memory cell.

FIG. 8 is a block diagram of a method 800 for simultaneously programming a first non-volatile memory cell and a second non-volatile memory cell. The first non-volatile memory cell is coupled to a first bit line decoder of a first decoder module. The second non-volatile memory cell is coupled to a first word line decoder of the first decoder module and is coupled to a second decoder module adjacent the first decoder module (Step 802). The first decoder module includes a first multiplexor circuit coupled to a positive bias node and a first bus. The second decoder module includes a second multiplexor circuit coupled to the positive bias node and a second bus.

At step 804, selectively coupling the first multiplexor circuit via the first bus to the first bit line decoder.

At step 806, selectively coupling the second multiplexor circuit via the second bus to the first word line decoder.

The second bus extends outside a boundary of the second decoder circuit into a boundary of the first decoder circuit. The first non-volatile memory cell and the second non-volatile memory cell each are programmed using positive and negative voltages.

One embodiment of the disclosed technology includes a non-volatile memory including a memory array that has a plurality of non-volatile memory cells, and a first decoder module coupled to the memory array. The first decoder module includes a first plurality of word line decoders coupled to the non-volatile memory cells, a first plurality of bit line decoders coupled to the non-volatile memory cells, a first multiplexor circuit configured to selectively couple one of the first plurality of word line decoders or one of the first plurality of bit line decoders to a positive bias node, and a second multiplexor circuit configured to selectively couple one of the first plurality of word line decoders or one of the first plurality of bit line decoders to a negative bias node. The first multiplexor circuit and the second multiplexor circuit are each coupled to a word line decoder and a bit line decoder that are outside a boundary of the first decoder module.

One embodiment of the disclosed technology includes a non-volatile memory including a memory array including a plurality of non-volatile memory cells, a first decoder module and a second decoder module both coupled to the memory array. The first decoder module includes a first word line decoder including a first selector circuit, a first bit line decoder including a second selector circuit, a first bus coupled to a first bias node, the first selector circuit and the second selector circuit, and a second bus coupled to a second bias node, the first selector circuit and the second selector circuit. The second decoder module is disposed adjacent a first boundary of the first decoder module and includes a second word line decoder including a third selector circuit, a second bit line decoder including a fourth selector circuit, a third bus coupled to the first bias node, the third selector circuit and the fourth selector circuit, and a fourth bus coupled to the second bias node, the third selector circuit and the fourth selector circuit. The first bus and the second bus are each coupled to the third selector circuit and the fourth selector circuit.

One embodiment of the disclosed technology includes a method that includes simultaneously programming a first non-volatile memory cell and a second non-volatile memory cell, the first non-volatile memory cell coupled to a first bit line decoder of a first decoder module, the second non-volatile memory cell coupled to a first word line decoder of the first decoder module and a second decoder module adjacent the first decoder module, the first decoder module including a first multiplexor circuit coupled to a positive bias node and a first bus, the second decoder module including a second multiplexor circuit coupled to the positive bias node and a second bus, by selectively coupling the first multiplexor circuit via the first bus to the first bit line decoder, and selectively coupling the second multiplexor circuit via the second bus to the first word line decoder. The second bus extends outside a boundary of the second decoder circuit into a boundary of the first decoder circuit. The first non-volatile memory cell and the second non-volatile memory cell each are programmed using positive and negative voltages.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A non-volatile memory comprising:
- a memory array comprising a plurality of non-volatile memory cells; and
- a first decoder module coupled to the memory array, the first decoder module comprising:
  - a first plurality of word line decoders coupled to the non-volatile memory cells;
  - a first plurality of bit line decoders coupled to the non-volatile memory cells;
  - a first multiplexor circuit configured to selectively couple one of the first plurality of word line decoders or one of the first plurality of bit line decoders to a positive bias node; and
  - a second multiplexor circuit configured to selectively couple one of the first plurality of word line decoders or one of the first plurality of bit line decoders to a negative bias node,
- wherein the first multiplexor circuit and the second multiplexor circuit are each coupled to a second word line decoder and a second bit line decoder that are each outside a boundary of the first decoder module.

2. The non-volatile memory of claim 1, further comprising:
- a first bus coupled to the first multiplexor circuit, the first plurality of word line decoders, the first plurality of bit line decoders, the second word line decoder, and the second bit line decoder; and
- a second bus coupled to the second multiplexor circuit, the first plurality of word line decoders, the first plurality of bit line decoders, the second word line decoder, and the second bit line decoder.

3. The non-volatile memory of claim 2, wherein the first bus and the second bus extend outside the boundary of the first decoder module.

4. The non-volatile memory of claim 2, further comprising a second decoder module, wherein the first bus and second bus extend into the second decoder module.

5. The non-volatile memory of claim 2, further comprising a plurality of decoder modules disposed adjacent the first decoder module, wherein the first bus and second bus extend into each of the plurality of second decoder modules.

6. The non-volatile memory of claim 2, further comprising:
- a second decoder module disposed above the first decoder module;
- a third decoder module disposed below the first decoder module;
- a fourth decoder module disposed left of the first decoder module; and
- a fifth decoder module disposed right of the first decoder module,
- wherein the first bus and second bus extend into the second, third, fourth and fifth decoder modules.

7. The non-volatile memory of claim 1, wherein:
- the memory array comprises a plurality of memory cells coupled to the first plurality of word line decoders and the first plurality of bit line decoders; and the plurality of memory cells each comprise a resistance-switching memory element.

8. The non-volatile memory of claim 7, wherein resistance-switching memory element comprises a magnetic memory element.

9. The non-volatile memory of claim 7, wherein the plurality of memory cells each comprise a selector element coupled in series with the resistance-switching memory element.

10. The non-volatile memory of claim 1, wherein:

the memory array comprises a plurality of memory cells coupled to the first plurality of word line decoders and the first plurality of bit line decoders; and each of the plurality of memory cells are programmed using positive and negative voltages.

11. The non-volatile memory of claim 1, comprising a magnetoresistive random access memory.

12. A non-volatile memory comprising:

a memory array comprising a plurality of non-volatile memory cells;

a first decoder module coupled to the memory array, the first decoder module comprising:

a first word line decoder comprising a first selector circuit;

a first bit line decoder comprising a second selector circuit;

a first bus coupled to a first bias node, the first selector circuit and the second selector circuit;

a second bus coupled to a second bias node, the first selector circuit and the second selector circuit; and a first multiplexor circuit configured to selectively couple the first bus to the first bias node;

a second decoder module coupled to the memory array, the second decoder disposed adjacent a first boundary of the first decoder module, the second decoder module comprising:

a second word line decoder comprising a third selector circuit;

a second bit line decoder comprising a fourth selector circuit;

a third bus coupled to the first bias node, the third selector circuit and the fourth selector circuit;

a fourth bus coupled to the second bias node, the third selector circuit and the fourth selector circuit; and a second multiplexor circuit configured to selectively couple the second bus to the second bias node, wherein the first bus and the second bus are each coupled to the third selector circuit and the fourth selector circuit and wherein the first multiplexor circuit and the second multiplexor circuit are configured to selectively drive the second word line decoder and the second bit line decoder.

13. The non-volatile memory of claim 12, wherein the third bus and the fourth bus are each coupled to the first selector circuit and the second selector circuit.

14. The non-volatile memory of claim 12, wherein:

the memory array comprises a plurality of memory cells coupled to the first word line decoder and the first bit line decoder; and each of the plurality of memory cells are programmed using positive and negative voltages.

15. The non-volatile memory of claim 12, wherein:

the memory array comprises a plurality of memory cells coupled to the first plurality of word line decoders and the first plurality of bit line decoders; and the plurality of memory cells each comprise a resistance-switching memory element.

16. The non-volatile memory of claim 15, wherein resistance-switching memory element comprises a magnetic memory element.

17. A method comprising:

simultaneously programming a first non-volatile memory cell and a second non-volatile memory cell, the first non-volatile memory cell coupled to a first bit line decoder of a first decoder module, the second non-volatile memory cell coupled to a first word line decoder of the first decoder module and a second decoder module adjacent the first decoder module, the first decoder module comprising a first multiplexor circuit coupled to a positive bias node and a first bus, the second decoder module comprising a second multiplexor circuit coupled to the positive bias node and a second bus, by:

selectively coupling the first multiplexor circuit via the first bus to the first bit line decoder; and selectively coupling the second multiplexor circuit via the second bus to the first word line decoder, wherein:

the second bus extends outside a boundary of a second decoder circuit into a boundary of a first decoder circuit; and the first non-volatile memory cell and the second non-volatile memory cell each are programmed using positive and negative voltages.

18. The method of claim 17, wherein the first non-volatile memory cell and the second non-volatile memory cell each comprises magnetic memory elements.

* * * * *